(12) United States Patent
Ding

(10) Patent No.: US 7,301,196 B2
(45) Date of Patent: Nov. 27, 2007

(54) NONVOLATILE MEMORIES AND METHODS OF FABRICATION

(75) Inventor: Yi Ding, Sunnyvale, CA (US)

(73) Assignee: ProMOS Technologies, Inc., Hsin Chu (TW)

( * ) Notice: Subject to any disclaimer, the term of this patent is extended or adjusted under 35 U.S.C. 154(b) by 316 days.

(21) Appl. No.: 11/112,702

(22) Filed: Apr. 22, 2005

(65) Prior Publication Data

US 2005/0184330 A1    Aug. 25, 2005

Related U.S. Application Data

(62) Division of application No. 10/393,212, filed on Mar. 19, 2003, now Pat. No. 6,962,851.

(51) Int. Cl.
*H01L 29/788*    (2006.01)

(52) U.S. Cl. .............................. 257/316; 257/E27.078

(58) Field of Classification Search ......... 257/E21.078
See application file for complete search history.

(56) References Cited

U.S. PATENT DOCUMENTS

| | | | |
|---|---|---|---|
| 4,701,776 A | 10/1987 | Perlegos et al. | |
| 5,268,319 A * | 12/1993 | Harari | ........................ 438/260 |
| 5,402,371 A | 3/1995 | Ono | |
| 5,408,115 A | 4/1995 | Chang | |
| 5,424,979 A | 6/1995 | Morii | |
| 5,445,983 A | 8/1995 | Hong | |
| 5,633,185 A | 5/1997 | Yiu et al. | |
| 5,668,757 A | 9/1997 | Jeng | |
| 5,705,415 A | 1/1998 | Orlowski et al. | |
| 5,821,143 A | 10/1998 | Kim et al. | |
| 5,856,943 A | 1/1999 | Jeng | |
| 5,901,084 A | 5/1999 | Ohnakado | |

(Continued)

OTHER PUBLICATIONS

Shirota, Riichiro "A Review of 256Mbit NAND Flash Memories and NAND Flash Future Trend," Feb. 2000, Nonvolatile Memory Workshop in Monterey, California, pp. 22-31.

(Continued)

*Primary Examiner*—Richard A. Booth
(74) *Attorney, Agent, or Firm*—Michael Shenker; MacPherson Kwok Chen & Heid LLP

(57) ABSTRACT

In a nonvolatile memory, substrate isolation regions (220) are formed in a semiconductor substrate (120). The substrate isolation regions are dielectric regions protruding above the substrate. Then select gate lines (140) are formed. Then a floating gate layer (160) is deposited. The floating gate layer is etched until the substrate isolation regions are exposed and the floating layer is removed from over at least a portion of the select gate lines. A dielectric (1510) is formed over the floating gate layer, and a control gate layer (170) is deposited. The control gate layer protrudes upward over each select gate line. These protrusions are exploited to define the control gates independently of photolithographic alignment. The floating gates are then defined independently of any photolithographic alignment other than the alignment involved in patterning the substrate isolation regions and the select gate lines. In another aspect, a nonvolatile memory cell has a conductive floating gate (160). A dielectric layer (1510) overlying the floating gate has a continuous feature that overlies the floating gate and also overlies the select gate (140). The control gate (160) overlies the continuous feature of the dielectric layer and also overlies the floating gate but not the select gate. In another aspect, substrate isolation regions (220) are formed in a semiconductor substrate. Select gate lines cross over the substrate isolation regions. Each select gate line has a planar top surface, but its bottom surface goes up and down over the substrate isolation regions. Other features are also provided.

13 Claims, 40 Drawing Sheets

(X-X')

U.S. PATENT DOCUMENTS

| | | | |
|---|---|---|---|
| 5,910,912 | A | 6/1999 | Hsu et al. |
| 5,912,843 | A | 6/1999 | Jeng |
| 5,918,124 | A | 6/1999 | Sung |
| 6,011,725 | A | 1/2000 | Eitan |
| 6,040,216 | A | 3/2000 | Sung |
| 6,057,575 | A | 5/2000 | Jenq |
| 6,107,141 | A | 8/2000 | Hsu et al. |
| 6,130,129 | A | 10/2000 | Chen |
| 6,133,098 | A | 10/2000 | Ogura et al. |
| 6,134,144 | A | 10/2000 | Lin et al. |
| 6,162,682 | A | 12/2000 | Kleine |
| 6,171,909 | B1 | 1/2001 | Ding et al. |
| 6,187,636 | B1 | 2/2001 | Jeong |
| 6,200,856 | B1 | 3/2001 | Chen |
| 6,214,669 | B1 | 4/2001 | Hisamune |
| 6,218,689 | B1 | 4/2001 | Chang et al. |
| 6,228,695 | B1 | 5/2001 | Hsieh et al. |
| 6,232,185 | B1 | 5/2001 | Wang |
| 6,261,856 | B1 | 7/2001 | Chang et al. |
| 6,265,739 | B1 | 7/2001 | Yaegashi et al. |
| 6,266,278 | B1 | 7/2001 | Harari et al. |
| 6,294,297 | B1 | 9/2001 | Chen |
| 6,326,661 | B1 | 12/2001 | Dormans et al. |
| 6,344,993 | B1 | 2/2002 | Harari et al. |
| 6,355,524 | B1 | 3/2002 | Tuan et al. |
| 6,365,457 | B1 | 4/2002 | Choi |
| 6,380,029 | B1 * | 4/2002 | Chang et al. ............... 438/257 |
| 6,388,293 | B1 | 5/2002 | Ogura et al. |
| 6,414,872 | B1 | 7/2002 | Bergemont et al. |
| 6,420,231 | B1 | 7/2002 | Harari et al. |
| 6,436,764 | B1 | 8/2002 | Hsieh |
| 6,437,360 | B1 | 8/2002 | Cho et al. |
| 6,438,036 | B2 | 8/2002 | Seki et al. |
| 6,468,865 | B1 | 10/2002 | Yang et al. |
| 6,486,023 | B1 | 11/2002 | Nagata |
| 6,518,618 | B1 | 2/2003 | Fazio et al. |
| 6,541,324 | B1 | 4/2003 | Wang |
| 6,541,829 | B2 | 4/2003 | Nishinohara et al. |
| 6,566,196 | B1 | 5/2003 | Haselden et al. |
| 6,635,533 | B1 | 10/2003 | Chang et al. |
| 6,642,103 | B2 | 11/2003 | Wils et al. |
| 6,660,589 | B2 | 12/2003 | Park |
| 6,696,340 | B2 | 2/2004 | Furuhata |
| 6,696,724 | B2 * | 2/2004 | Verhaar ...................... 257/314 |
| 6,747,310 | B2 | 6/2004 | Fan et al. |
| 6,764,905 | B2 | 7/2004 | Jeng et al. |
| 6,803,276 | B2 | 10/2004 | Kim et al. |
| 2002/0064071 | A1 | 5/2002 | Takahashi et al. |
| 2002/0197888 | A1 | 12/2002 | Huang et al. |
| 2003/0205776 | A1 | 11/2003 | Yaegashi et al. |

OTHER PUBLICATIONS

Naruke, K.; Yamada, S.; Obi, E.; Taguchi, S.; and Wada, M. "A New Flash-Erase EEPROM Cell with A Sidewall Select-Gate On Its Source Side," 1989 IEEE, pp. 604-606.

Wu, A.T.; Chan T.Y.; Ko, P.K.; and Hu, C. "A Novel High-Speed, 5-Volt Programming EPROM Structure With Source-Side Injection," 1986 IEEE, 584-587.

Mizutani, Yoshihisa; and Makita, Koji "A New EPROM Cell With A Sidewall Floating Gate Fro High-Density and High Performance Device," 1985 IEEE, 635-638.

Ma, Y.; Pang, C.S.; Pathak, J.; Tsao, S.C.; Chang, C.F.; Yamauchi, Y.; Yoshimi, M. "A Novel High Density Contactless Flash Memory Array Using Split-Gate Source-Side-Injection Cell for 5V-Only Applications," 1994 Symposium on VLSI Technology Digest of Technical Papers, pp. 49-50.

Mih, Rebecca et al. "0.18um Modular Triple Self-Aligned Embedded Split-Gate Flash Memory," 2000 Symposium on VLSI Technology Digest of Technical Papers, pp. 120-121.

Ma, Yale et al., "A Dual-Bit Split-Gate EEPROM (DSG) Cell in Contactless Array for Single Vcc High Density Flash Memories," 1994 IEEE, 3.5.1-3.5.4.

Spinelli, Alessandro S., "Quantum-Mechanical 2D Simulation of Surface-and Buried-Channel p-MOS,"2000 International Conference on Simulation of Semiconductor Processes and Devices: SISPAD 2000, Seattle, Wa Sep. 6-8, 2000.

Kim, K.S. et al. "A Novel Dual String NOR (DuSnor) Memory Cell Technolgy Scalabe to the 256 Mbit a 1 Gbit Flash Memories," 1995 IEEE 11.1.1-11.1.4.

Bergement, A. et al."NOR Virtual Ground (NVG)- A New Scaling Concept for Very High Density FLAS EEPROM and its Implementation in a 0.5 um Process," 1993 IEEE 2.2.1-2.2.4.

Van Duuren, Michiel et al., "Compact poly-CMP Embedded Flash Memory Cells For One or Two Bit Storage," Philips Research Leuven, Kapeldreef 75, B3001 Leuven, Belgium, pp. 73-74.

U.S. Appl. No. 10/440,466, entitled "Fabrication Of Conductive Gates For Nonvolatile Memories From Layers With Protruding Portions," Filed on May 16, 2003.

U.S. Appl. No. 10/440,005, entitled "Fabrication of Dielectric On A Gate Surface To Insulate The Gate From Another Element Of An Integrated Circuit," Filed on May 16, 2003.

U.S. Appl. No. 10/440,508, entitled "Fabrication Of Gate Dielectric In Nonvolatile Memories Having Select, Floating and Control Gates," Filed on May 16, 2003.

U.S. Appl. No. 10/440,500, entitled "Integrated Circuits With Openings that Allow Electrical Contact To Conductive Features Having Self-Aligned Edges," Filed on May 16, 2003.

U.S. Appl. No. 10/393,212, entitled "Nonvolatile Memories And Methods Of Fabrication," Filed on Mar. 19, 2003.

U.S. Appl. No. 10/411,813, entitled "Nonvolatile Memories With A Floating Gate Having An Upward Protrusion," Filed on Apr. 10, 2003.

U.S. Appl. No. 10/393,202, entitled "Fabrication of Integrated Circuit Elements In Structures With Protruding Features," Filed on Mar. 19, 2003.

U.S. Appl. No. 10/631,941, entitled "Nonvolatile Memory Cell With Multiple Floating Gates Formed After The Select Gate," Filed on Jul. 30, 2003.

U.S. Appl. No. 10/632,155, entitled "Nonvolatile Memory Cells With Buried Channel Transistors," Filed on Jul. 30, 2003.

U.S. Appl. No. 10/632,007, entitled "Arrays Of Nonvolatile Memory Cells Wherein Each Cell Has Two Conductive Floating Gates," Filed on Jul. 30, 2003.

U.S. Appl. No. 10/632,452, entitled "Fabrication Of Dielectric For A Nonvolatile Memory Cell Having Multiple Floating Gates," Filed on Jul. 30, 2003.

U.S. Appl. No. 10/632,154, entitled "Fabrication Of Gate Dielectric In Nonvolatile Memories In Which A Memory Cell Has Mutiple Floating Gates," Filed on Jul. 30, 2003.

U.S. Appl. No. 10/632,186, entitled "Nonvolatile Memory Cell With Multiple Floating Gates Formed After The Select Gate And Having Upward Protrusions," Filed on Jul. 30, 2003.

U.S. Appl. No. 10/631,552, entitled "Nonvolatile Memories And Methods Of Fabrication," Filed on Jul. 30, 2003.

* cited by examiner

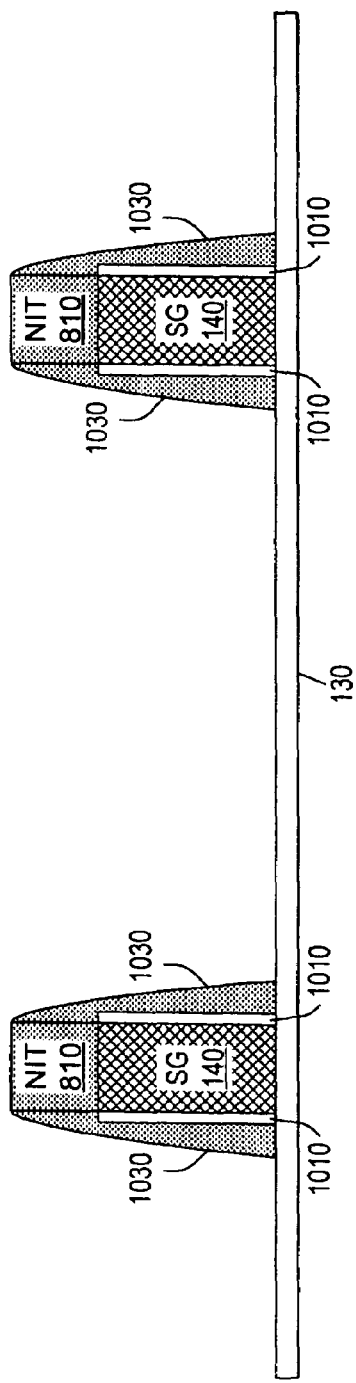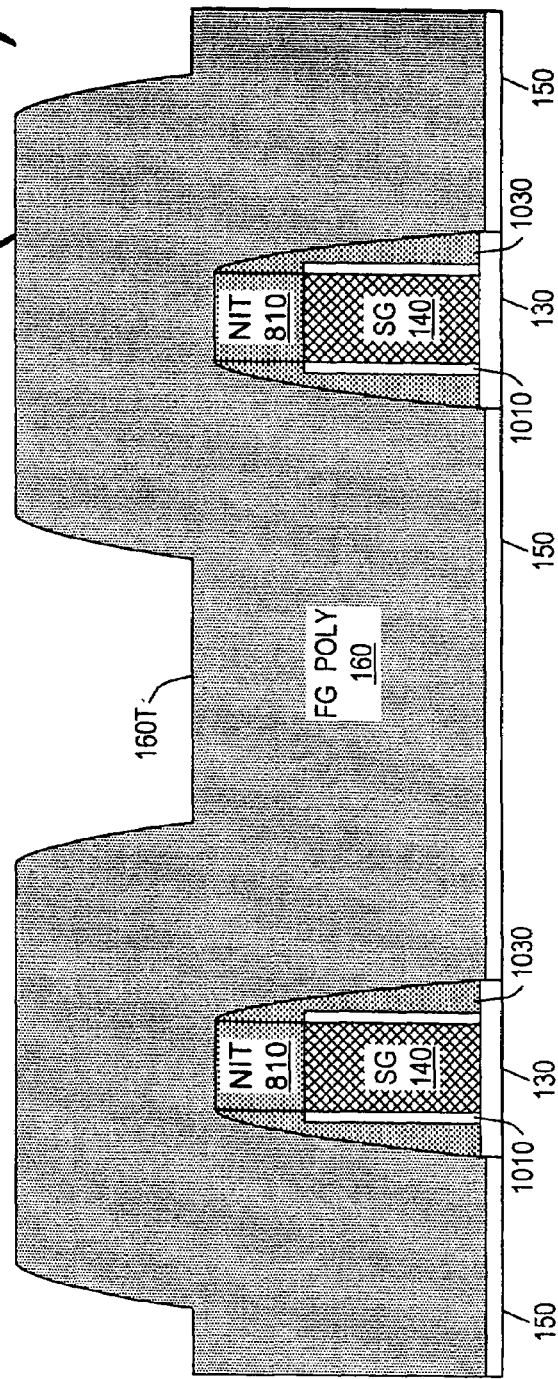

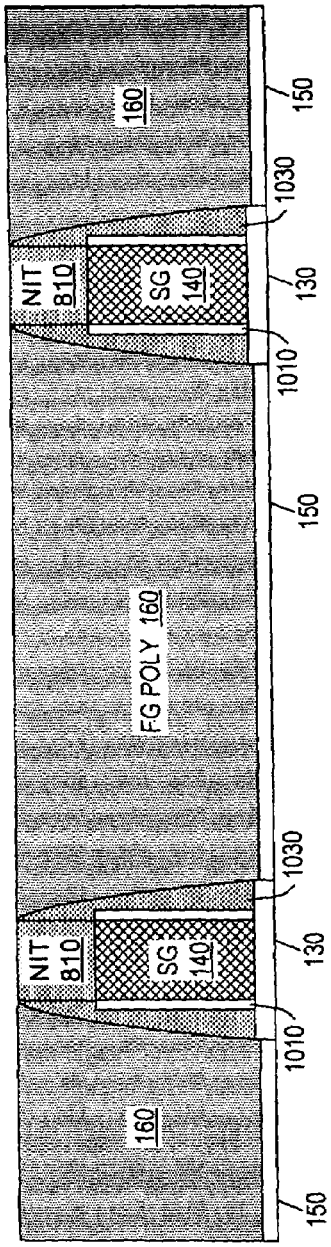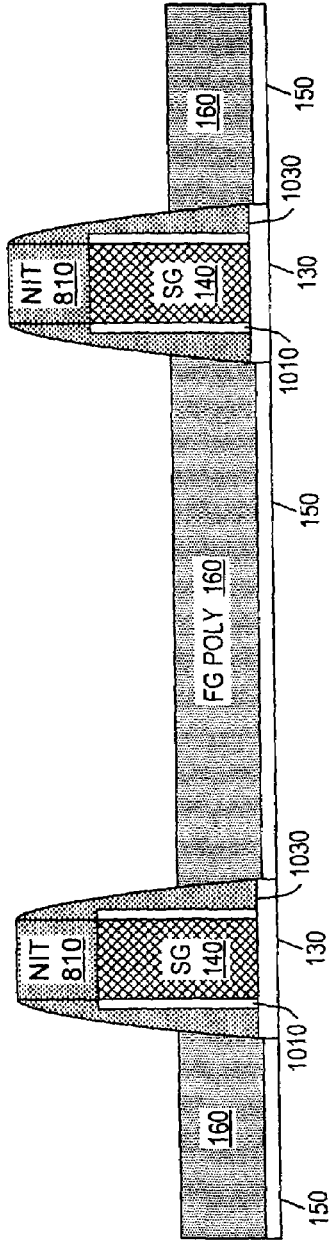

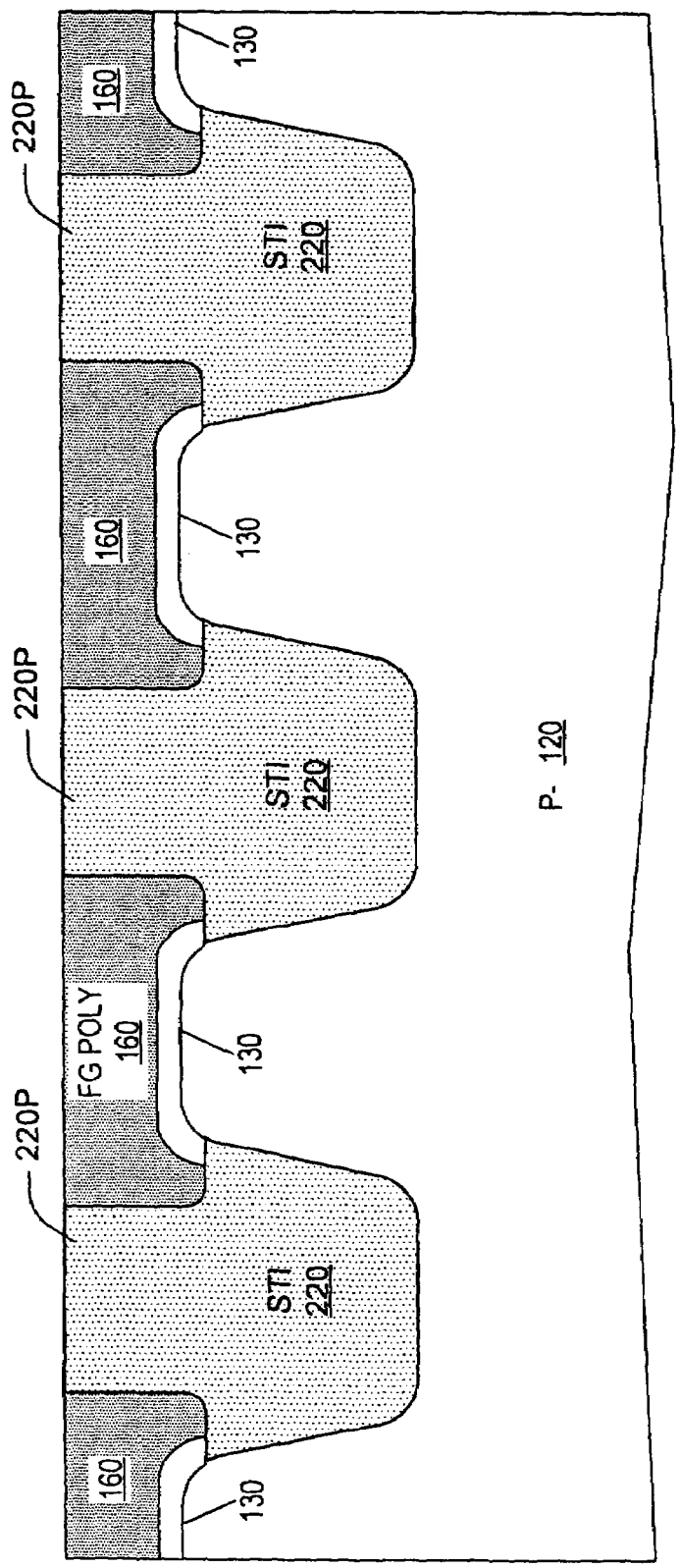
FIG. 13B (Y2-Y2')

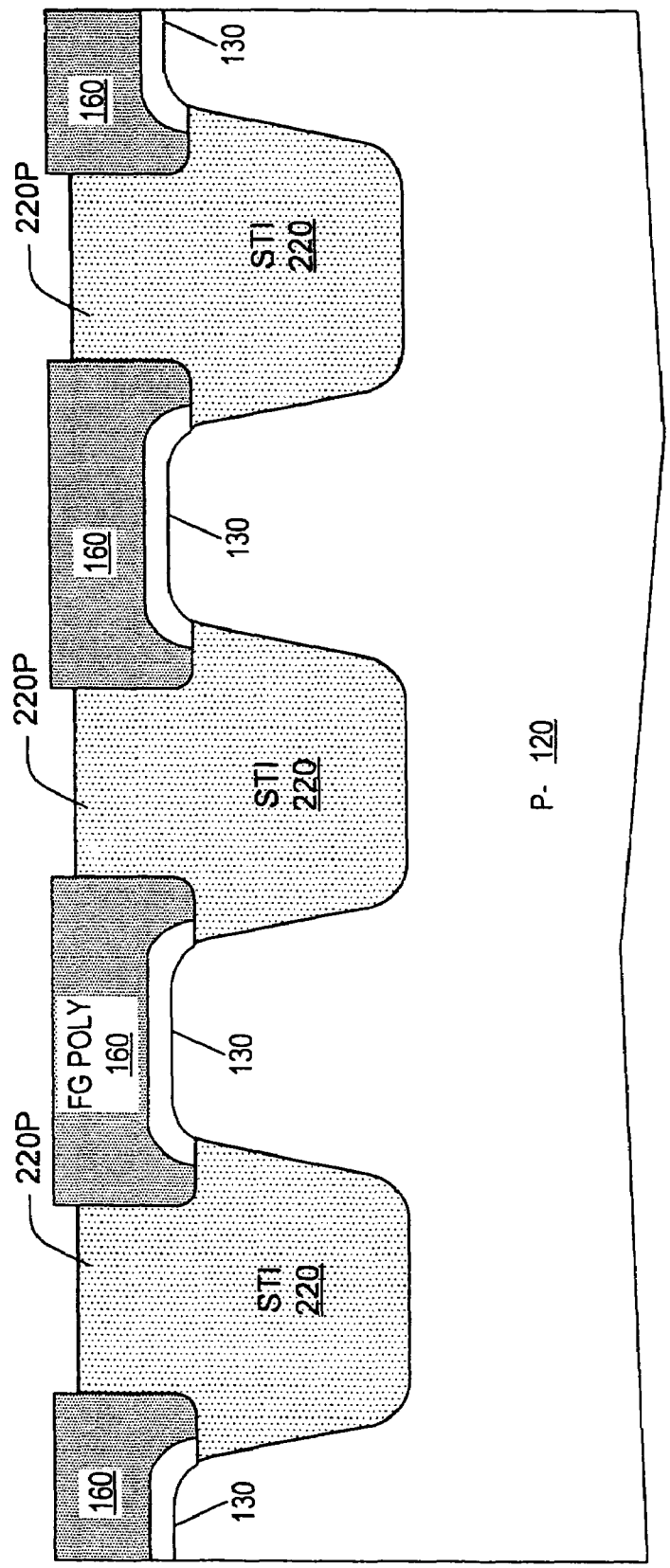
FIG. 14 (Y2-Y2')

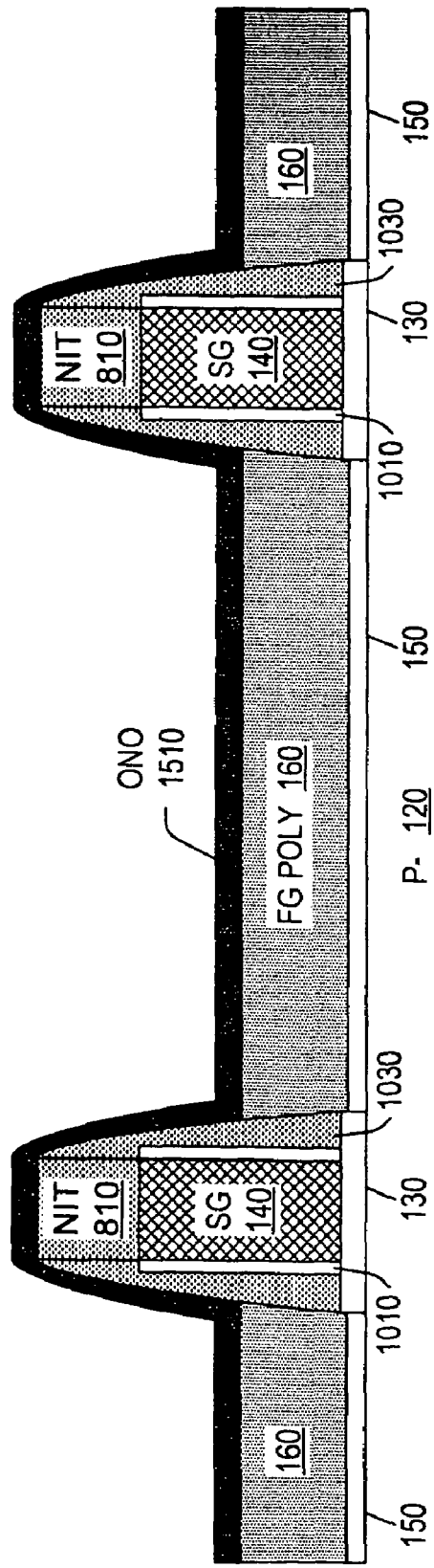
FIG. 15A (X-X')

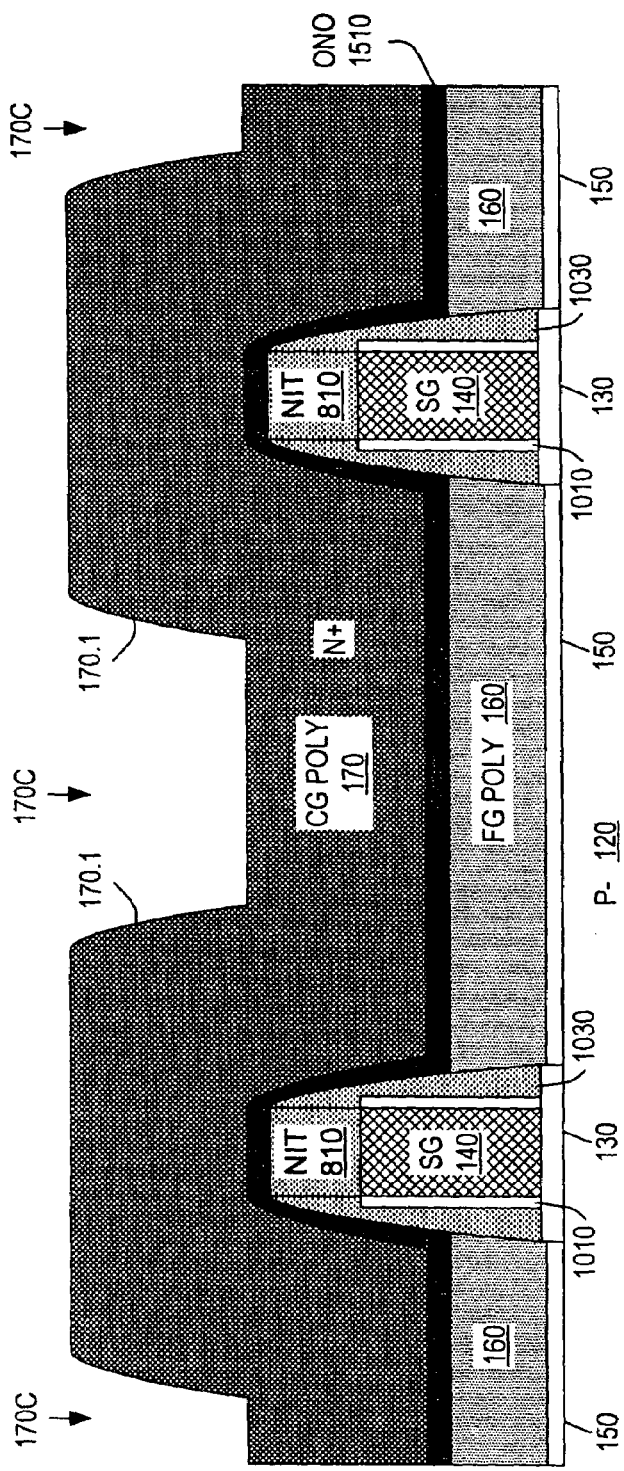
FIG. 16A (X-X')
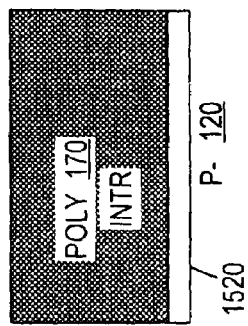
FIG. 16B

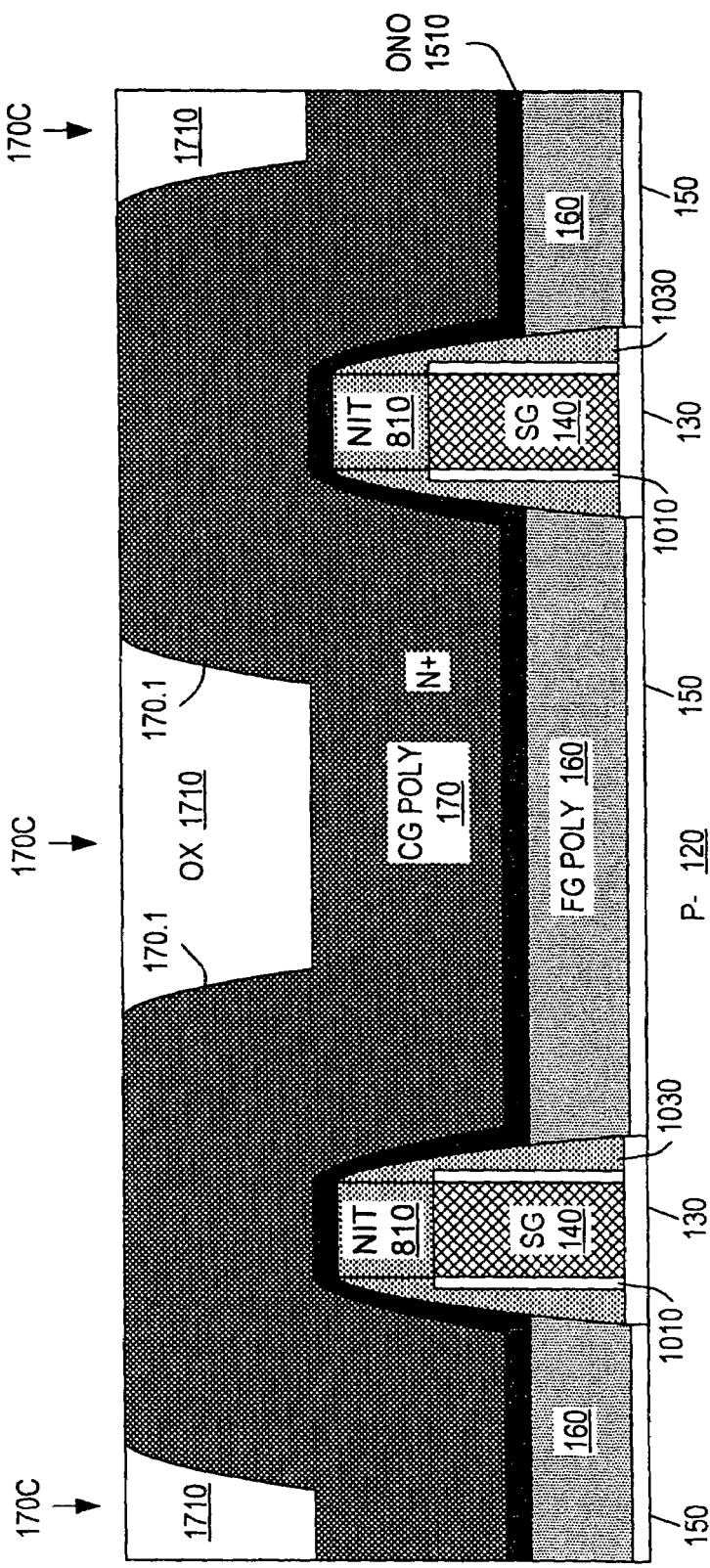
FIG. 17A (X-X')

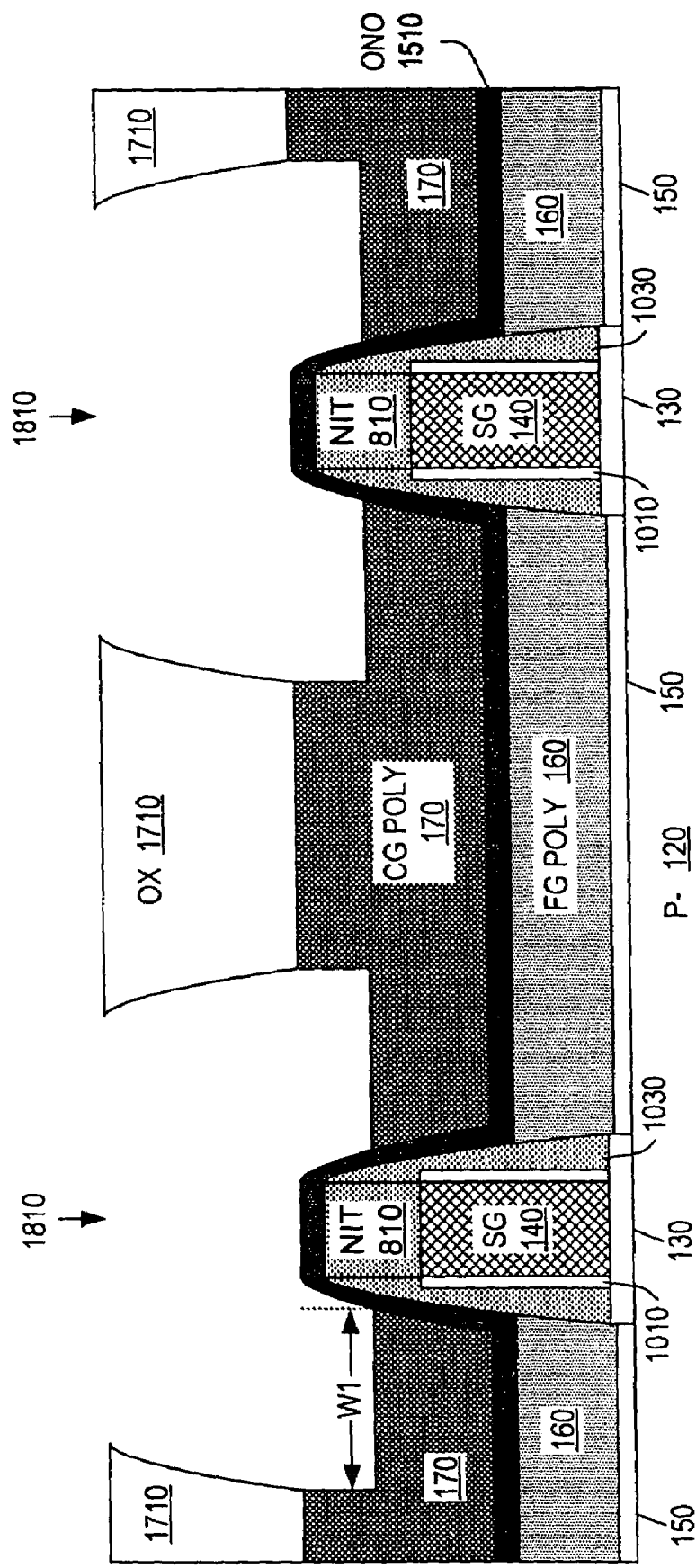
FIG. 18 (X-X')

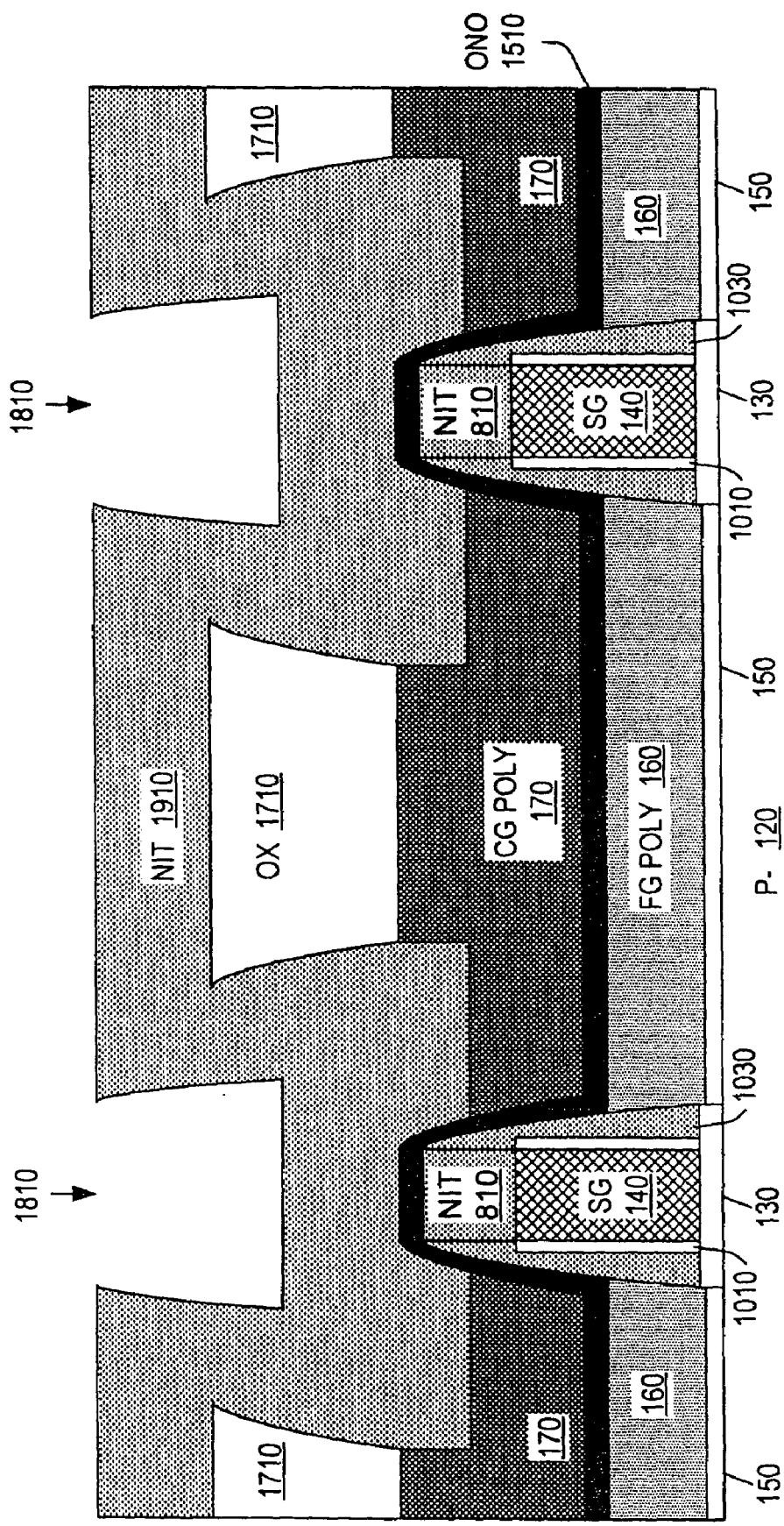

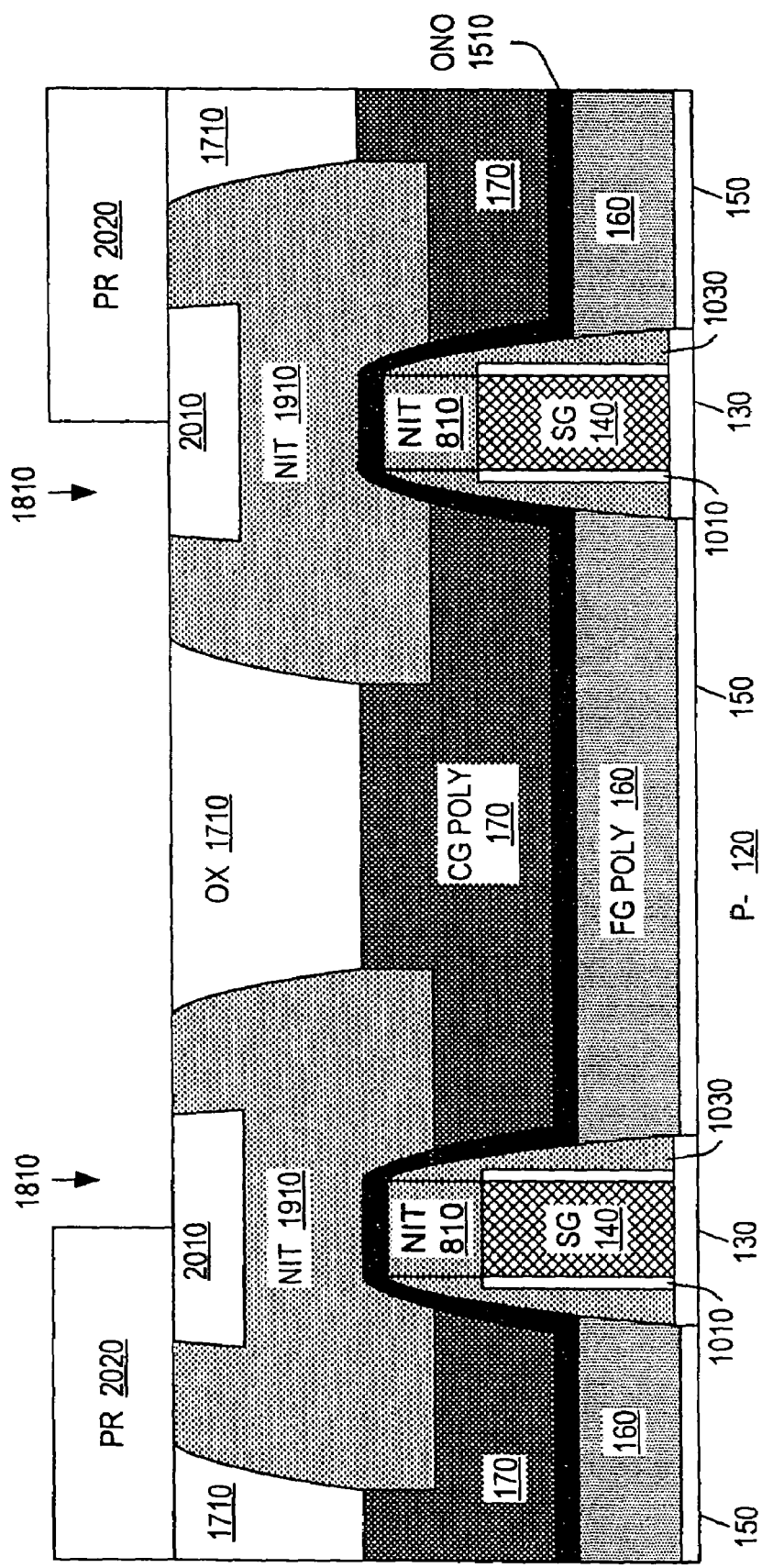
FIG. 20A (X-X')

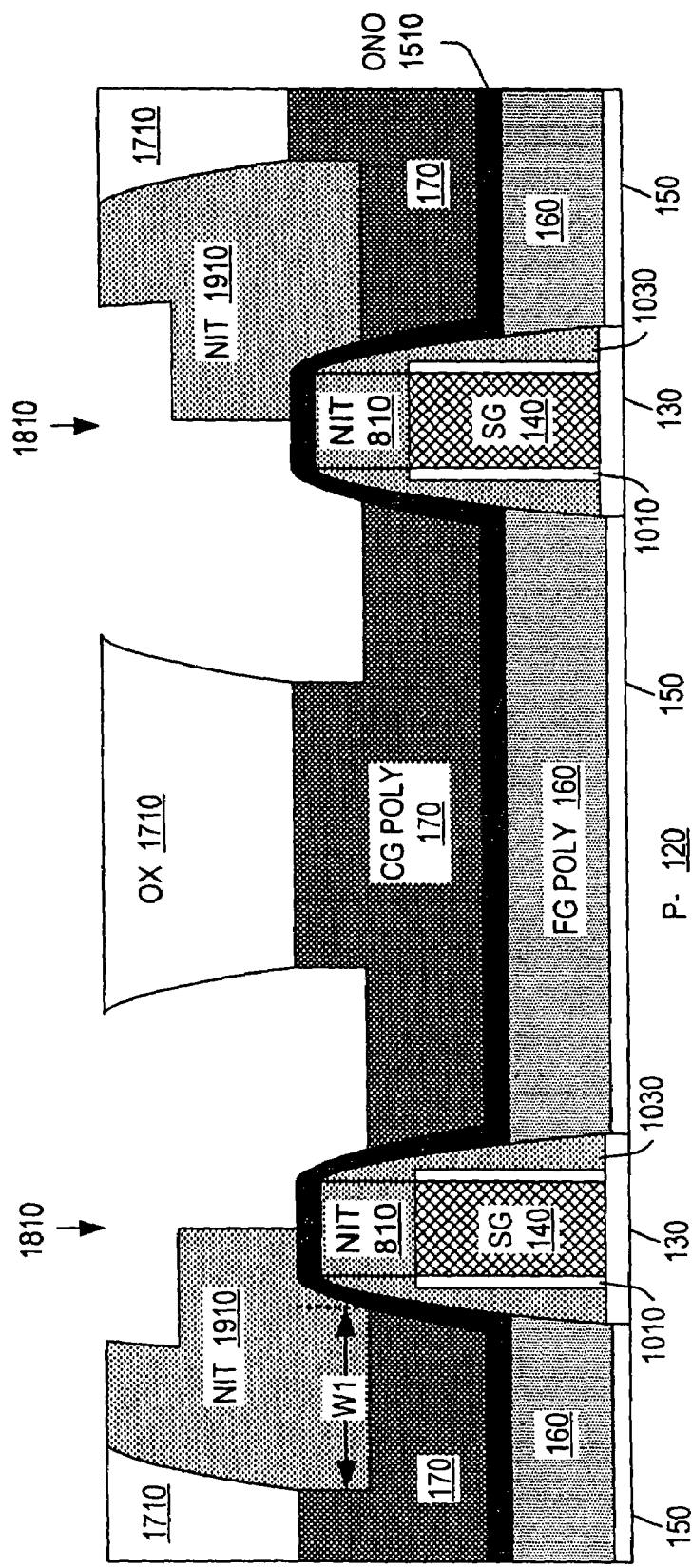
FIG. 21 (X-X')

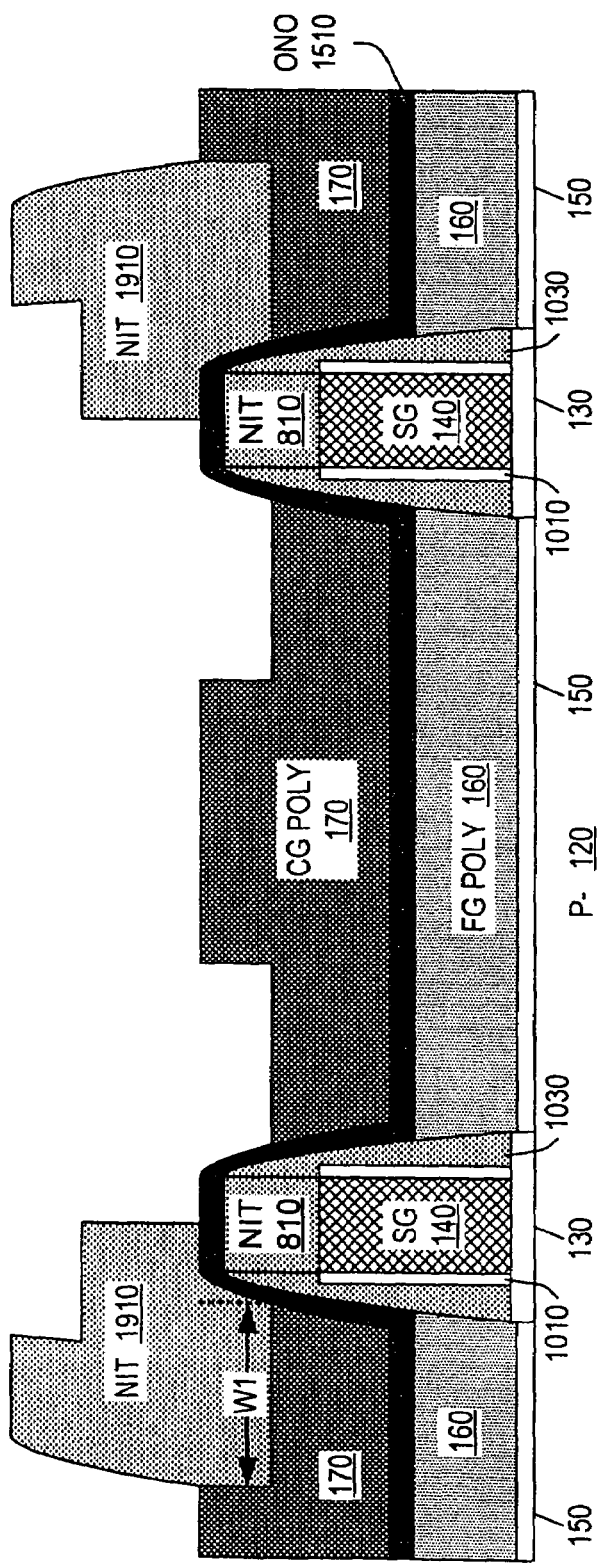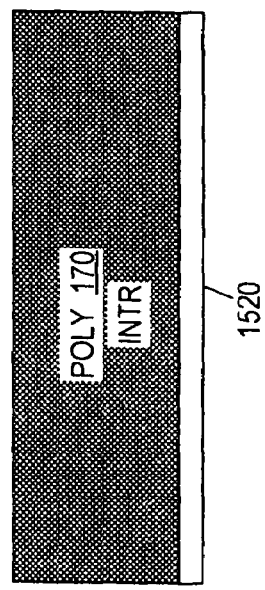
FIG. 22A (X-X')
FIG. 22B

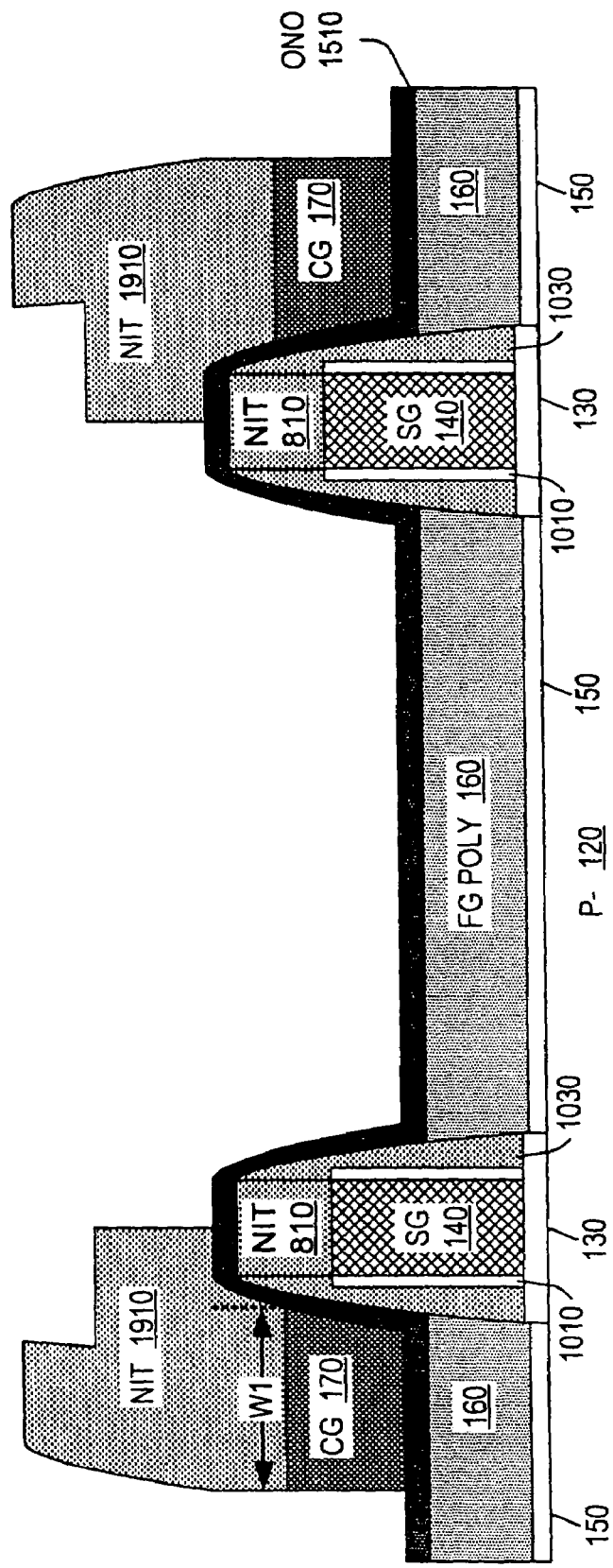

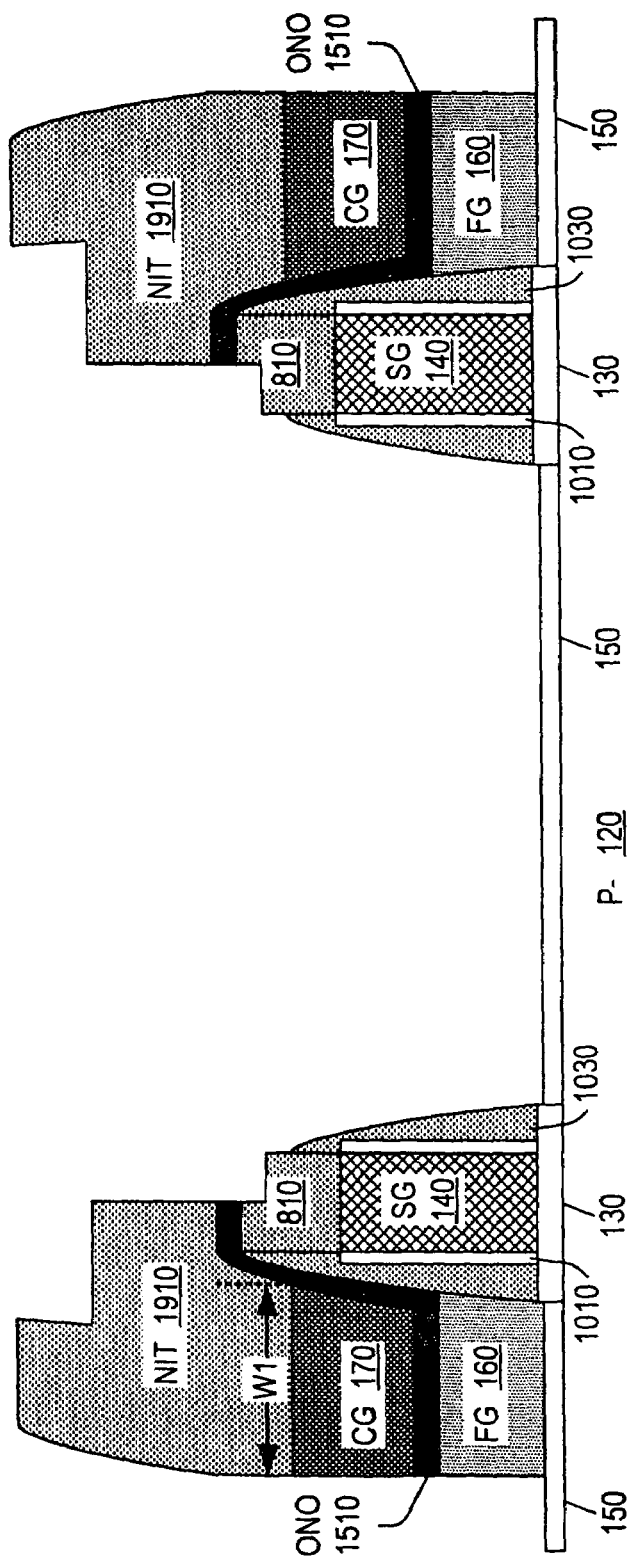
FIG. 24 (X-X')

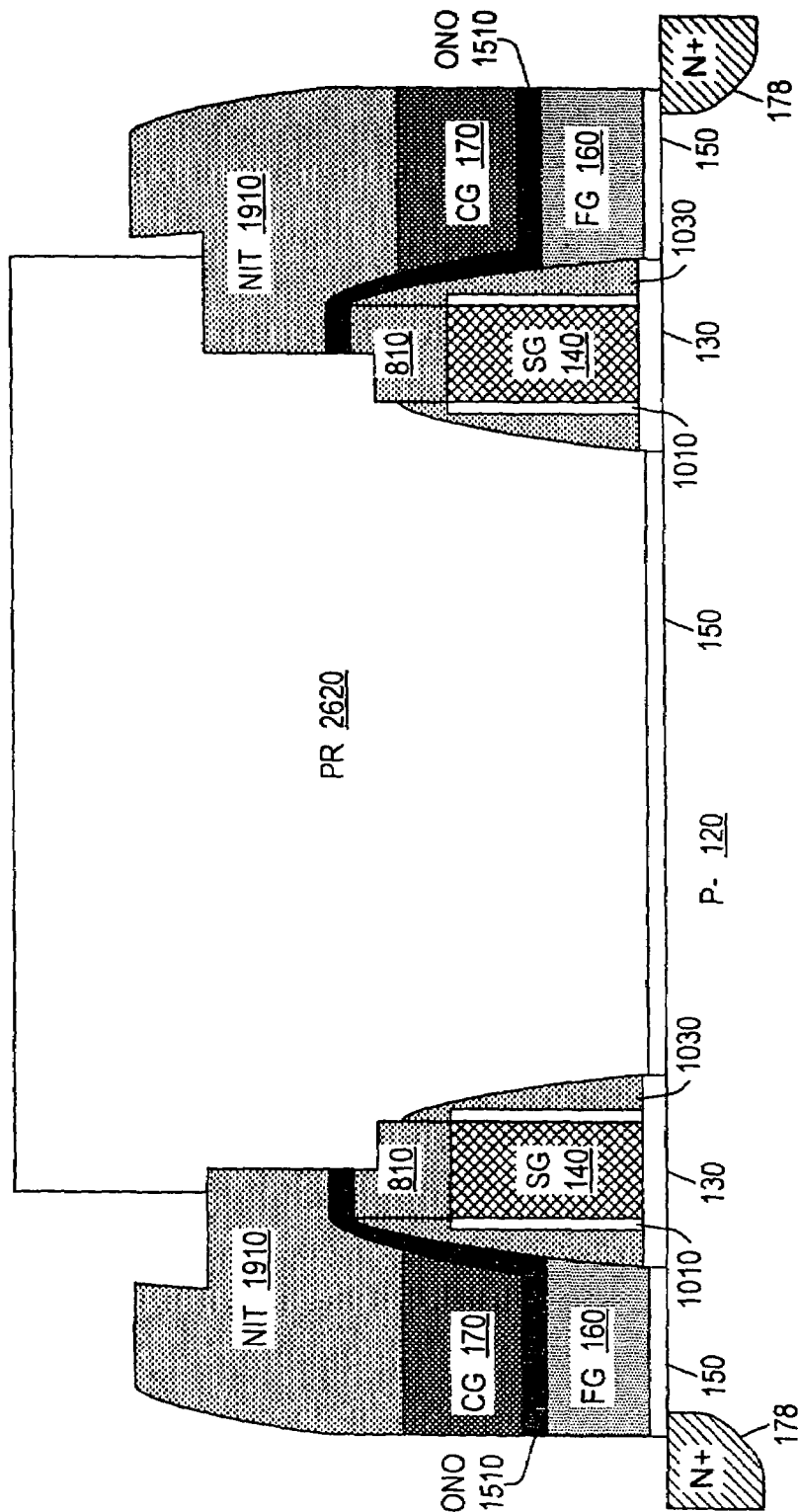

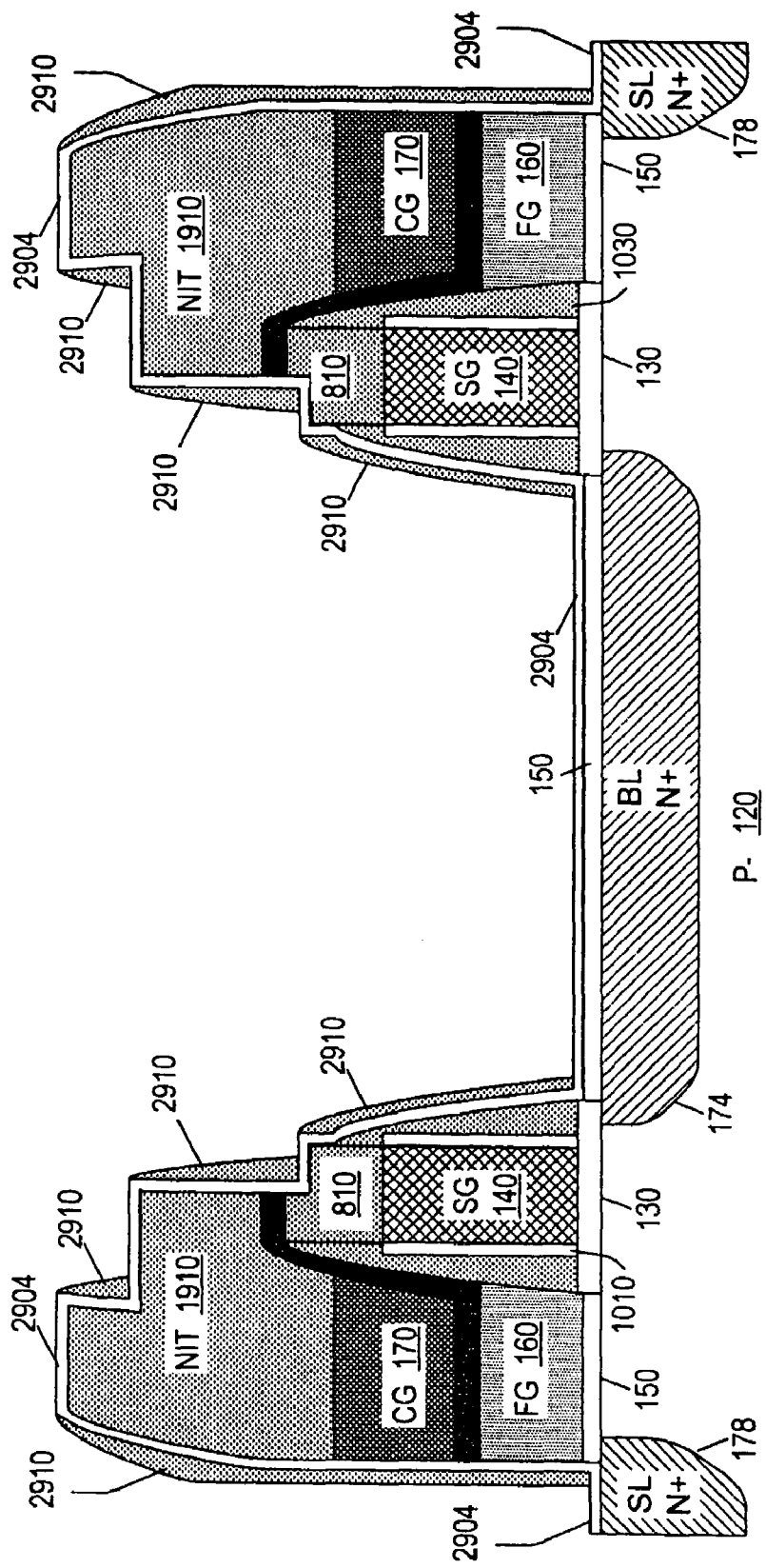
FIG. 29A (X-X')

FIG. 31 (X-X')

NONVOLATILE MEMORIES AND METHODS OF FABRICATION

CROSS REFERENCE TO RELATED APPLICATIONS

The present application is a division of U.S. patent application no. 10/393,212 filed on Mar. 19, 2003, incorporated herein by reference now U.S Pat. No. 6,962,851.

BACKGROUND OF THE INVENTION

The present invention relates to nonvolatile memories.

FIG. 1 shows a cross section of a flash memory cell described in U.S. Pat. No. 6,057,575 issued May 2, 2000 to Jenq. The cell is formed in and over a semiconductor substrate 120. Silicon dioxide 130 is thermally grown on substrate 120. Select. gate 140 is formed on oxide 130. Silicon dioxide 150 is thermally grown on a region of substrate 120 not covered by the select gate. ONO 154 (a sandwich of a layer of silicon dioxide, a layer of silicon nitride, and a layer of silicon dioxide) is formed on select gate 140. Floating gate 160 is formed on dielectric layers 150, 154. A portion of floating gate 160 overlies the select gate 140.

ONO layer 164 is formed on the floating and select gates. Control gate 170 is formed on ONO 164. The control gate overlies floating gate 160 and select gate 140.

N+ source and drain regions 174, 178 are formed in substrate 120.

The cell is programmed by hot electron injection from the cell's channel region 180 (a P type region of substrate 120) to floating gate 160. The cell is erased by Fowler-Nordheim tunneling of electrons from floating gate 160 to source region 178.

The cell is fabricated by a self-aligned process in which the left and right edges of floating gate 160 and control gate 170 are defined by a single mask.

Another self-aligned fabrication process is described in Naruke et al., "A New Flash-Erase EEPROM Cell with a Sidewall Select-Gate on Its Source Side", IEDM Technical Digest 1989, pages 603-606. In that process, the floating and control gates are formed first in a stacked configuration. Then the select gate is formed as a sidewall spacer on a sidewall of a structure including the floating and control gates.

SUMMARY

This section summarizes some features of the invention. Other features are described in subsequent sections. The invention is defined by the appended claims which are incorporated into this section by reference.

The present invention includes self-aligned memory structures (the structures in which different features are defined by a single mask), but the invention is not limited to such structures.

In some embodiments of the present invention, substrate isolation regions are formed in a semiconductor substrate. Each substrate isolation region is a dielectric region protruding above the substrate. Then the select gates are formed. The select gates are part of select gate lines. Each select gate line provides select gates for at least one memory row. Then a floating gate layer (e.g. polysilicon) is deposited. The floating gate layer is etched until the substrate isolation regions are exposed. In some embodiments, the exposure of the substrate isolation regions serves as an end point for the floating gate layer etch.

In some embodiments, the memory also has control gates. A control gate layer is deposited over the floating gate layer. The control gate layer protrudes upward over each select gate line. These protrusions are exploited to define the control gates in a self-aligned manner. The floating gates are then also defined in a self-aligned manner.

One embodiment of the present invention is a nonvolatile memory cell comprising a conductive floating gate. A dielectric layer overlying the floating gate has a continuous feature that overlies the floating gate and also overlies the select gate. The control gate overlies the continuous feature of the dielectric layer and also overlies the floating gate but does not overlie the select gate.

One embodiment of the present invention is an integrated circuit comprising a nonvolatile memory. Substrate isolation regions are formed for the memory in a semiconductor substrate. Each substrate isolation region is a dielectric region protruding above the substrate. Select gate lines cross over the substrate isolation regions. Each select gate line has a planar top surface but not a planar bottom surface. The bottom surface of the select gate line goes up and down over the substrate isolation regions.

In some embodiments, a nonvolatile memory has peripheral NMOS and/or PMOS transistors. The transistor gates include a semiconductor material, e.g. polysilicon. In many circuits, it is preferable to make the NMOS transistor gates of type N, and the PMOS transistor gates to type P, in order to provide low threshold voltages at high channel doping levels. The high channel doping is desirable in short channel transistors to mitigate the short channel effect. See e.g. Wolf, "Silicon Processing for the VLSI Era", volume 3 ("The Submicron MOSFET"), 1995, pages 289-291, incorporated herein by reference. Thus, it is desirable to make the MOSFET transistor gates to have the same conductivity type as the source/drain regions.

In some embodiments of the present invention, the fabrication process allows doping of the NMOS transistor gates to be performed in the same step as the doping of the NMOS source/drain regions. Similarly, the PMOS transistor gates can be doped in the same step as the PMOS source/drain regions.

The invention is not limited to these embodiments. Other features of the invention are described below. The invention is defined by the appended claims.

BRIEF DESCRIPTION OF THE DRAWINGS

FIGS. 10, 11, 12, 13A, 13B, 14, 15A, 15B, 16A, 16B, 17A, 17B, 18, 19A, 19B, 20A show cross sections of the memory of FIG. 2 in the process of fabrication.

FIGS. 21, 22A, 22B, 23, 24, 25, 26A, 26B show cross sections of the memory of FIG. 2 in the process of fabrication.

FIGS. 27, 28, 29A, 29B show cross sections of the memory of FIG. 2 in the process of fabrication.

DESCRIPTION OF SOME EMBODIMENTS

The embodiments described in this section illustrate but do not limit the invention. The invention is not limited to particular materials, process steps, or dimensions. The invention is defined by the appended claims.

Figure 1:
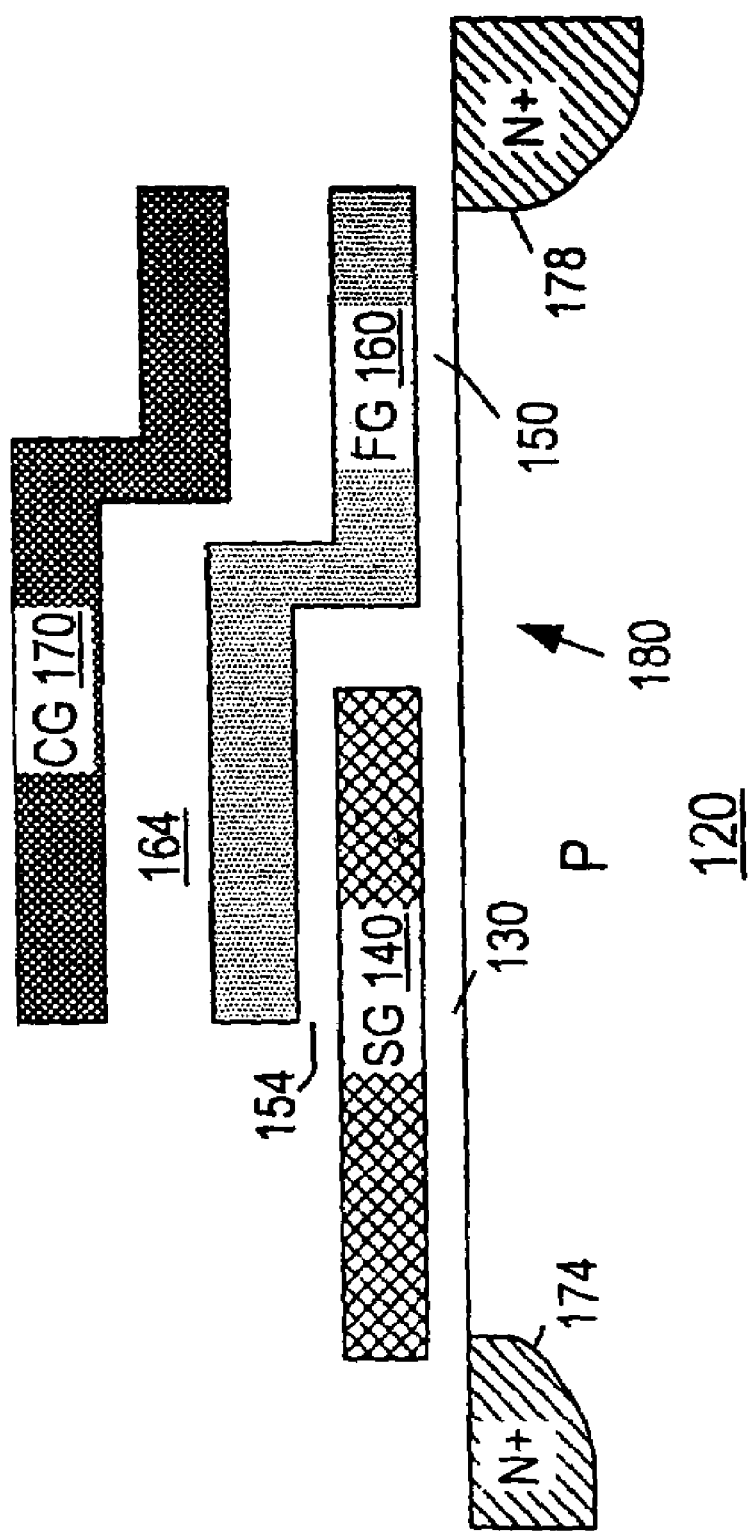
FIG. 1 shows a cross section of a prior art memory cell.
Figure 2:
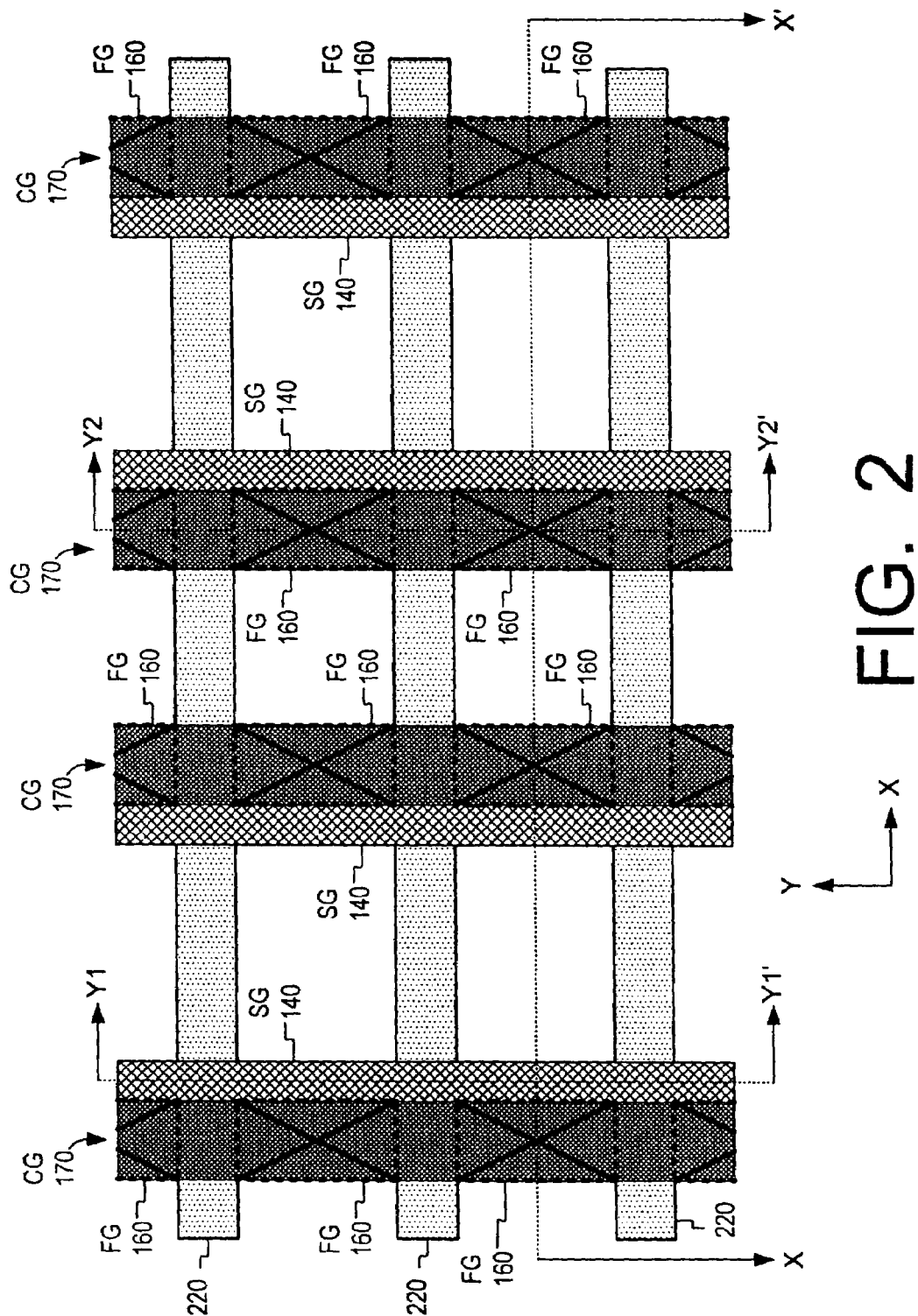
FIG. 2 is a top view of an intermediate structure obtained in the fabrication of a memory according to one embodiment of the present invention.
Figure 3:
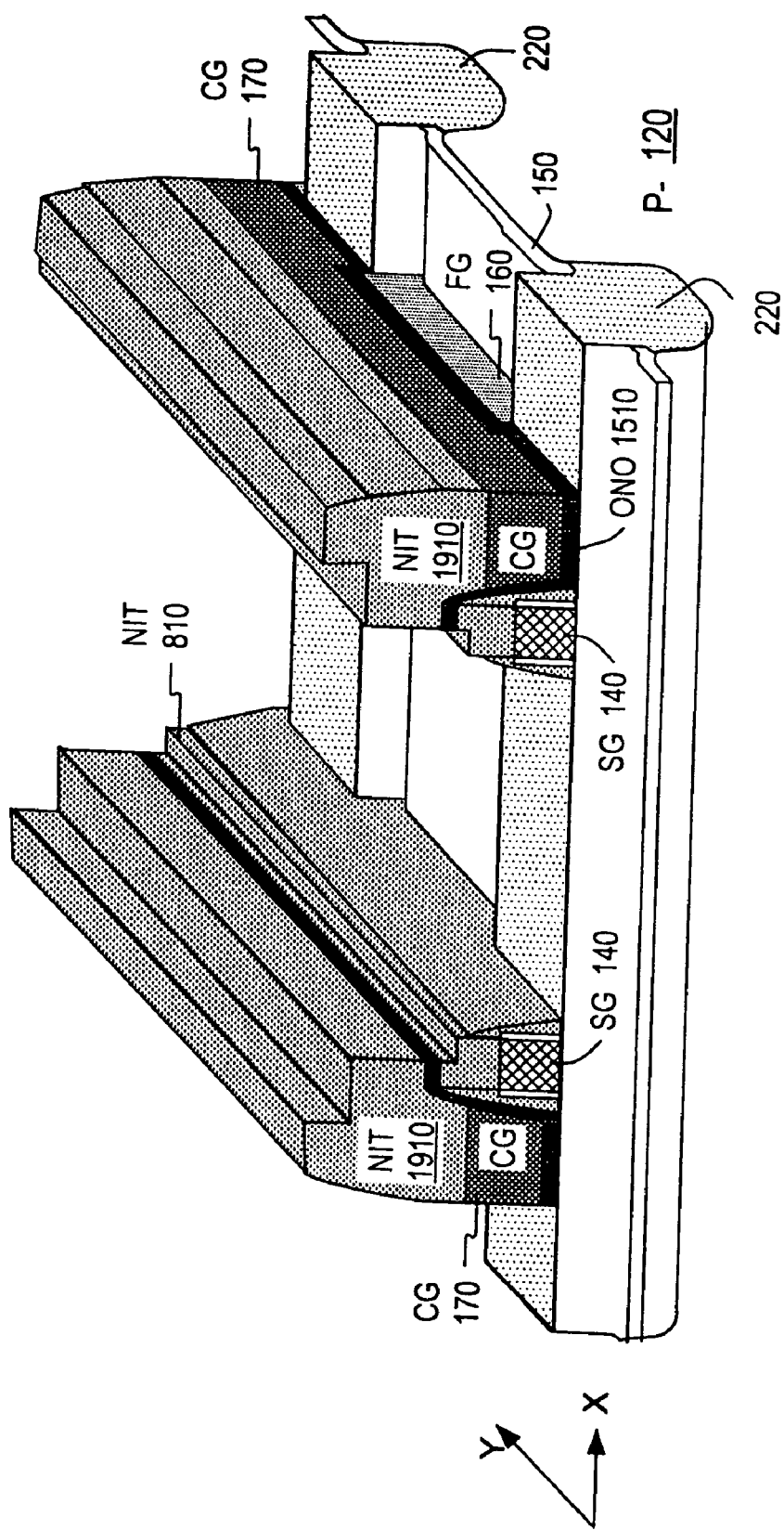
FIG. 3 is a perspective view of the memory of FIG. 2 in the process of fabrication.

FIG. 2 is a top view showing some features of a split gate flash memory array according to one embodiment of the present invention. FIG. 3 is a perspective view showing additional features. Each memory cell includes a floating gate 160, a control gate 170, and a select gate 140. The floating, control and select gates are insulated from each other and from semiconductor substrate 120 (e.g. monocrystalline silicon). Each control gate 170 is part of a control gate line, also referenced by numeral 170, that extends in the Y direction across the array. In some embodiments, the Y direction is a row direction, and each control gate line 170 provides the control gates for one row of the memory cells. Different control gate lines 170 may or may not be electrically tied together. Floating gates 160 underlie the control gates. The position of each floating gate 160 is shown with a cross in FIG. 2. Each select gate 140 is part of a select gate line, also referenced at 140, extending across the array in the Y direction. Substrate isolation regions 220 (field isolation regions) extend in the X direction. In some embodiments, the X direction is the column (bitline) direction. Each region 220 traverses the entire array. Each select gate line 140 and each control gate line 170 crosses over all of the regions 220.

Subsequent figures illustrate vertical cross sections of intermediate structures obtained during the memory fabrication. The sectional planes are indicated in FIG. 2 by lines X-X', Y1-Y1', and Y2-Y2'. The line X-X' passes in the X direction between substrate isolation regions 220. The line Y1-Y1' passes in the Y direction through a select gate line 140. The line Y2-Y2' passes in the Y direction through a control gate line 170.

Figure 4:
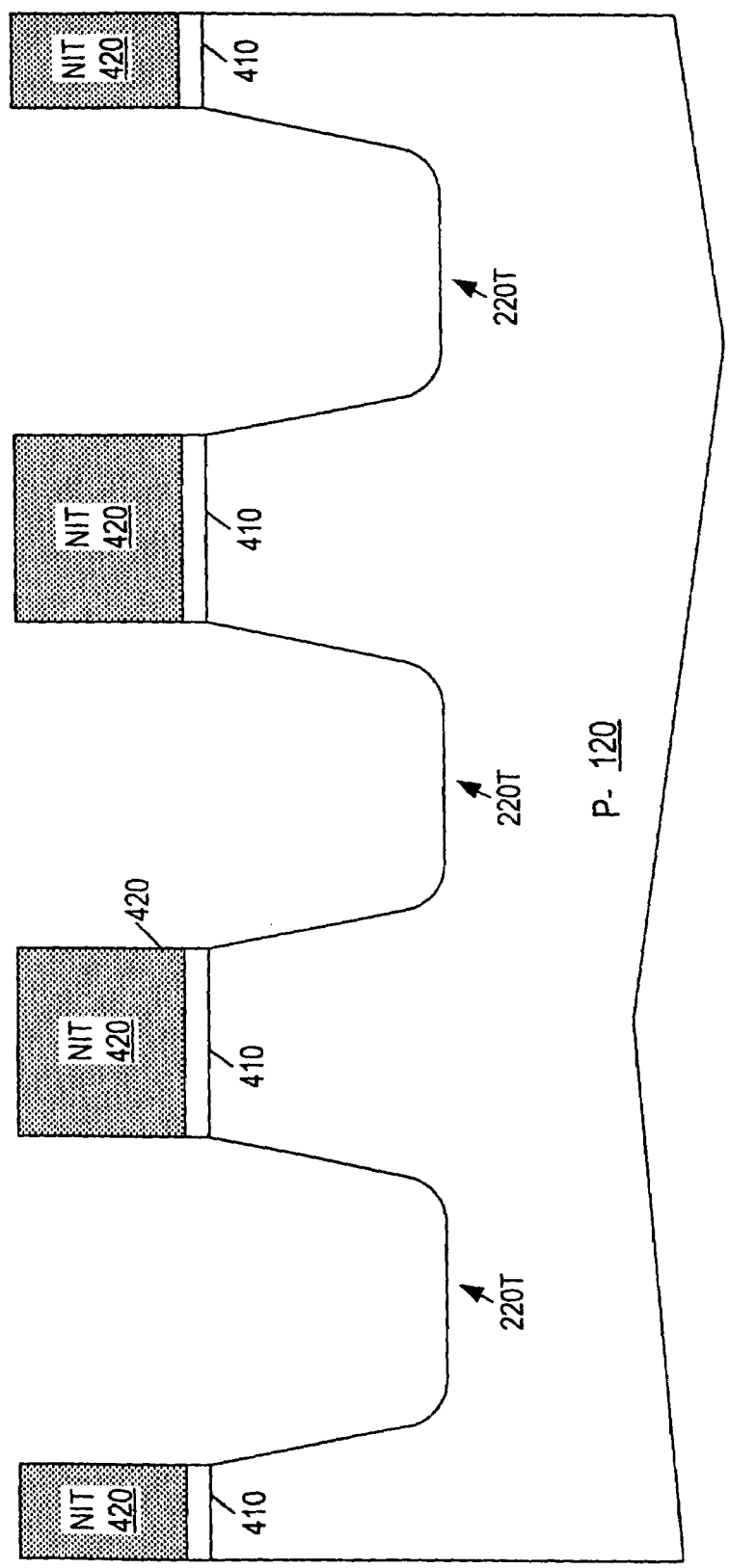
FIGS. 4-8 show cross sections of the memory of FIG. 2 in the process of fabrication.

In one embodiment, the memory is fabricated as follows. Substrate isolation regions 220 are formed in P doped substrate 120 by shallow trench isolation ("STI") technology. More particularly, as shown in FIG. 4 (the Y1-Y1' cross section), a silicon dioxide layer 410 (pad oxide) is formed on substrate 120 by thermal oxidation or some other technique. Silicon nitride 420 is deposited on oxide 410. Nitride 420 is patterned photolithographically, using a photoresist mask (not shown), to define isolation trenches 220T. Oxide 410 and substrate 120 are etched through the openings in nitride 420. Trenches 220T are formed in the substrate as a result. Each trench 220T traverses the entire memory array in the X direction.

Nitride 420 is subjected to a timed wet etch to recess the vertical edges of the nitride layer away from trenches 220T. See FIG. 5 (cross section Y1-Y1'). Oxide 410 is also recessed away from the trenches in this step.

A thin layer 220.1 of silicon dioxide is thermally grown on the exposed silicon surfaces to round the edges of trenches 220T. Then silicon dioxide 220.2 is deposited using a high density plasma technique (HDP). Oxide 220.2 fills the trenches and initially covers the nitride 420. Oxide 220.2 is polished by chemical mechanical polishing (CMP). The polishing stops on nitride 420. A planar top surface is provided.

In the subsequent figures and FIGS. 2 and 3, the layers 220.1, 220.2 are shown as a single layer 220.

Figure 5:
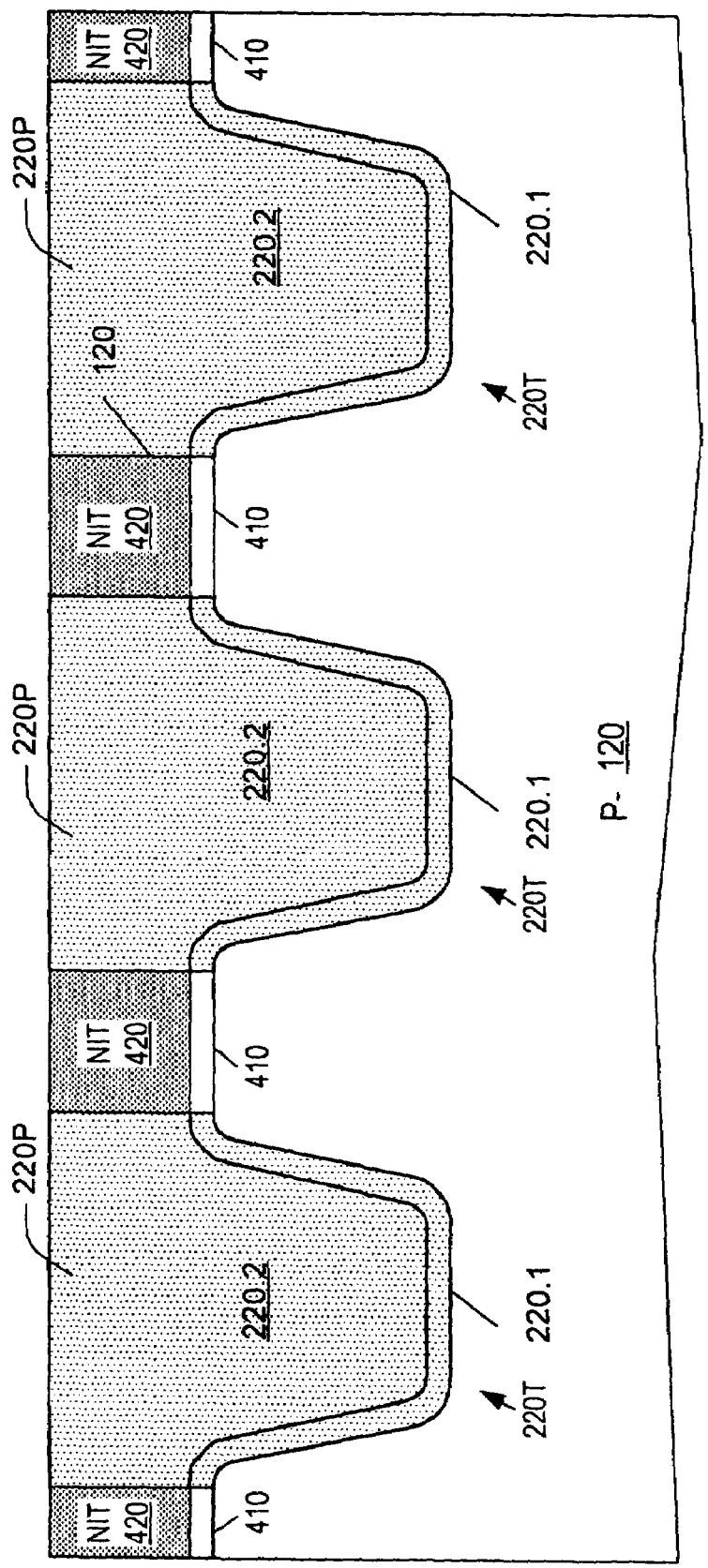

As shown in FIG. 5, oxide 220 protrudes above the substrate 120 by an amount equal to the combined thickness of nitride 420 and oxide 410. The protruding portions of oxide 220 are shown at 220P.

Figure 6:
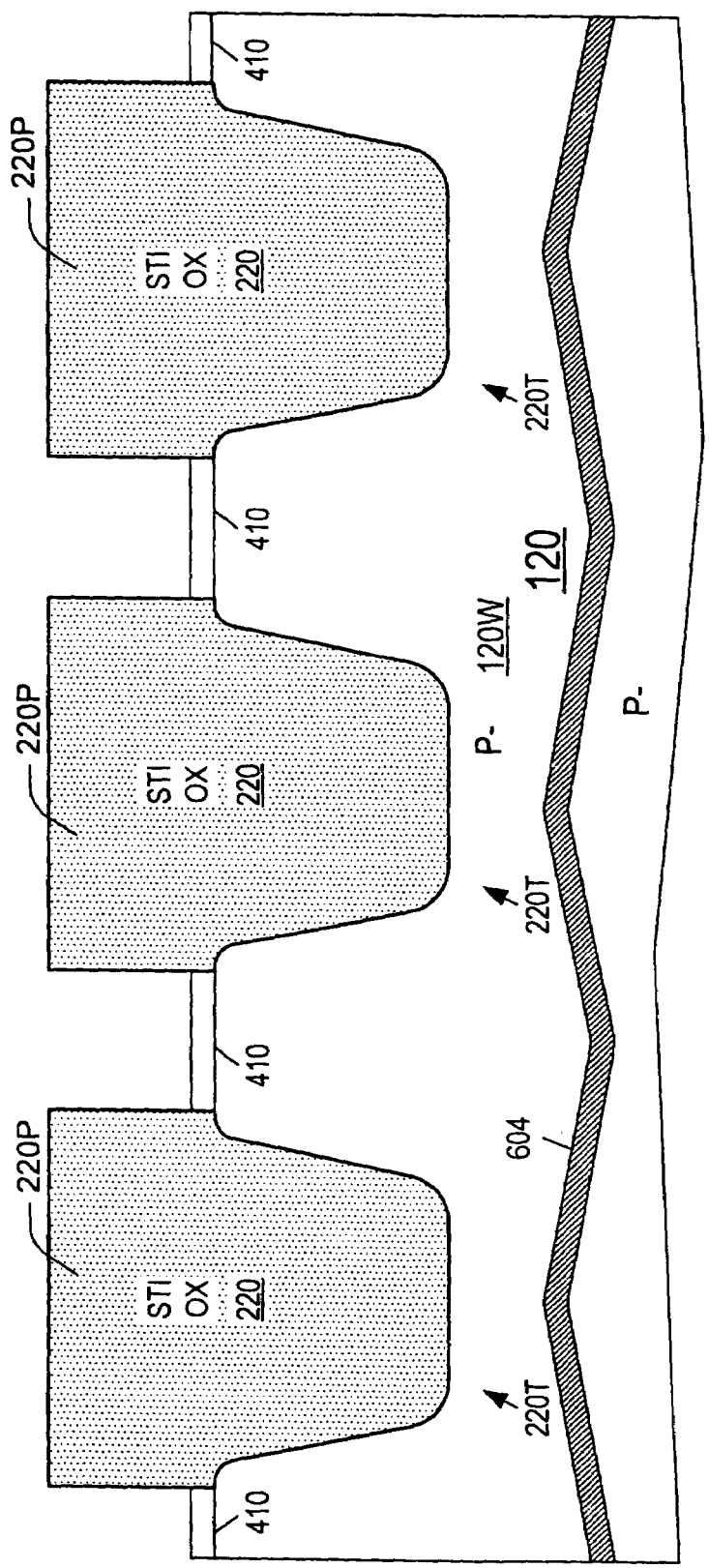

Nitride 420 is removed selectively to oxide 220 (FIG. 6, cross section Y1-Y1'). This can be done by a wet etch (e.g. with phosphoric acid).

Dopant is implanted into substrate 120 to form an N type region 604 underlying the memory array. Dopant is also implanted into the substrate around the array to form an N type region (not shown) extending from the top surface of substrate 120 down to region 604. These implants create a fully isolated P well 120W for the memory array. Region 604 is not shown in the subsequent drawings.

Figure 7:
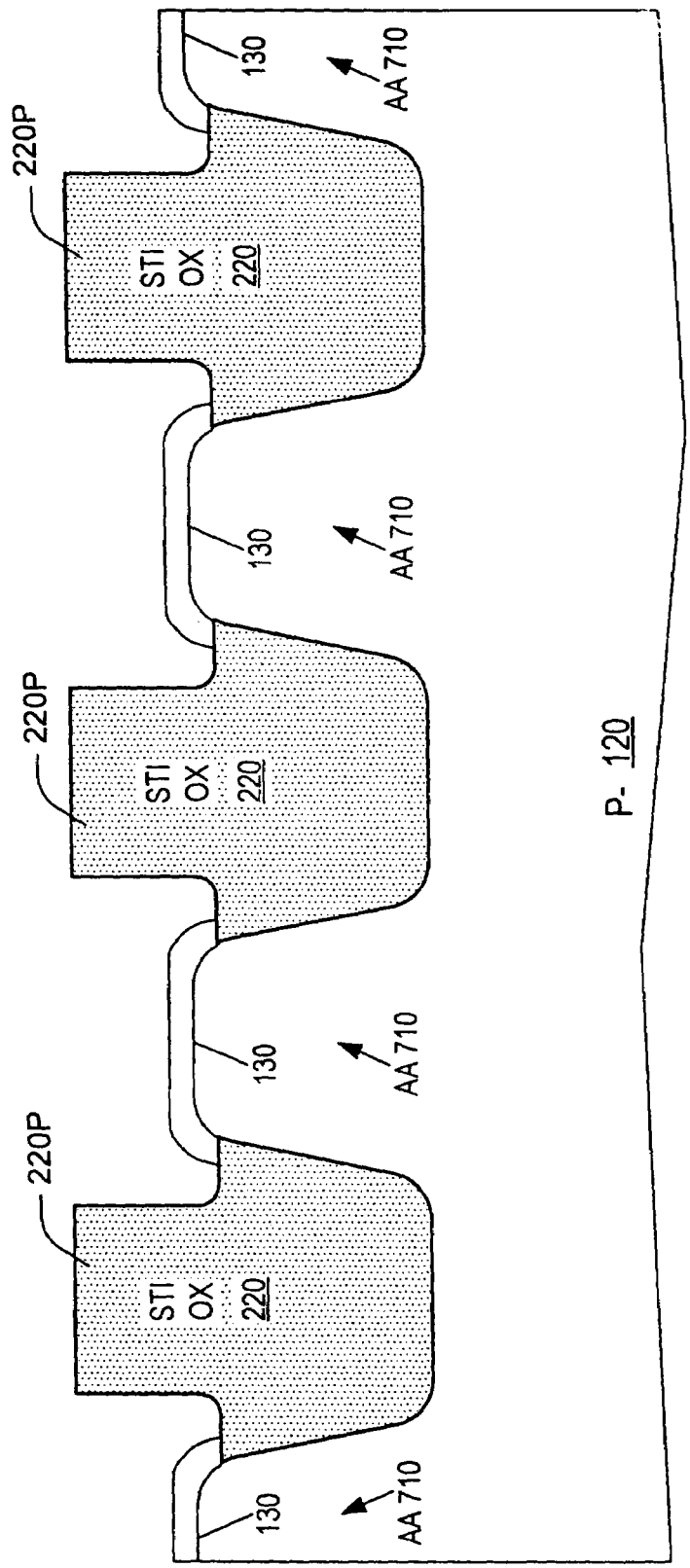

Oxide 220 is subjected to an etch (FIG. 7, cross section Y1-Y1'). The etch includes a horizontal component that causes the sidewalls of oxide 220 to be laterally recessed away from active areas 710 (the substrate areas not occupied by trenches 220T). The etch can be an isotropic wet etch. A buffered oxide etch or a dilute HF (DHF) etch is used in some embodiments. This etch will result in improved capacitive coupling between the floating and control gates. See U.S. patent application Ser. No. 10/262,785 filed Oct. 1, 2002 by Yi Ding and incorporated herein by reference.

Portions 220P of oxide 220 are not etched away, and they continue to protrude above the top surface of substrate 120. An exemplary final thickness of the protruding portions 220P is 0.12 μm for a 0.18 μm fabrication process (a process with a 0.18 μm minimum line width). The exemplary dimensions given in this section assume a 0.18 μm fabrication process unless mentioned otherwise.

Pad oxide 410 is removed during the etch of oxide 220.

Silicon dioxide 130 is thermally grown on the exposed areas of substrate 120 to provide gate dielectric for the select transistors. An exemplary thickness of oxide 130 is 120 Å.

Figure 8:
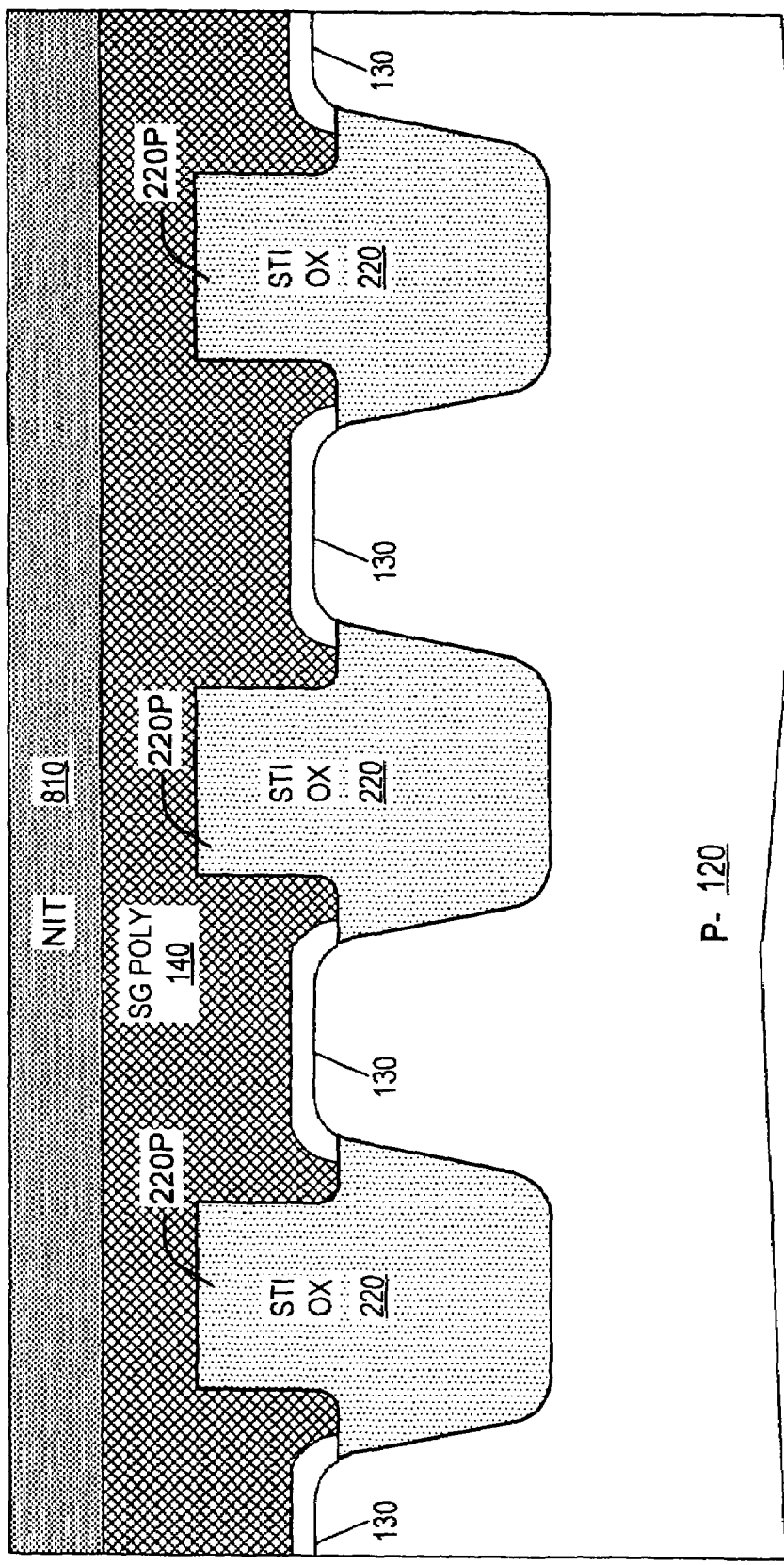

As shown in FIG. 8 (cross section Y1-Y1'), a conductive polysilicon layer 140 is formed over the structure by a conformal deposition process (e.g. low pressure chemical vapor deposition, "LPCVD"). Polysilicon 140 fills the spaces between the oxide protrusions 220P. The top polysilicon surface is planar because the polysilicon portions deposited on the sidewalls of protrusions 220P meet together.

Non-conformal deposition processes, whether known or to be invented, can also be used. If the top surface of polysilicon 140 is not planar, it is believed that the polysilicon 140 can be planarized after the deposition using known techniques (e.g. spinning a photoresist layer over the polysilicon 140 and then simultaneously etching the resist and the polysilicon at equal etch rates until all of the photoresist is removed). The bottom surface of polysilicon 140 is non-planar as it goes up and down over the oxide protrusions 220P.

An exemplary final thickness of polysilicon 140 is 0.06 μm over the active areas.

Silicon nitride 810 is deposited on polysilicon 140, by LPCVD for example, to an exemplary thickness of 1500 Å. If desired, a pad oxide layer (not shown) can be formed on polysilicon 140 before the nitride deposition. The pad oxide layer will provide an additional protection for the select gates during the etch of control gate polysilicon 170 described below in connection with FIG. 18.

In some embodiments, the top surface of polysilicon 140 and/or nitride 810 is not planar.

Figure 9:
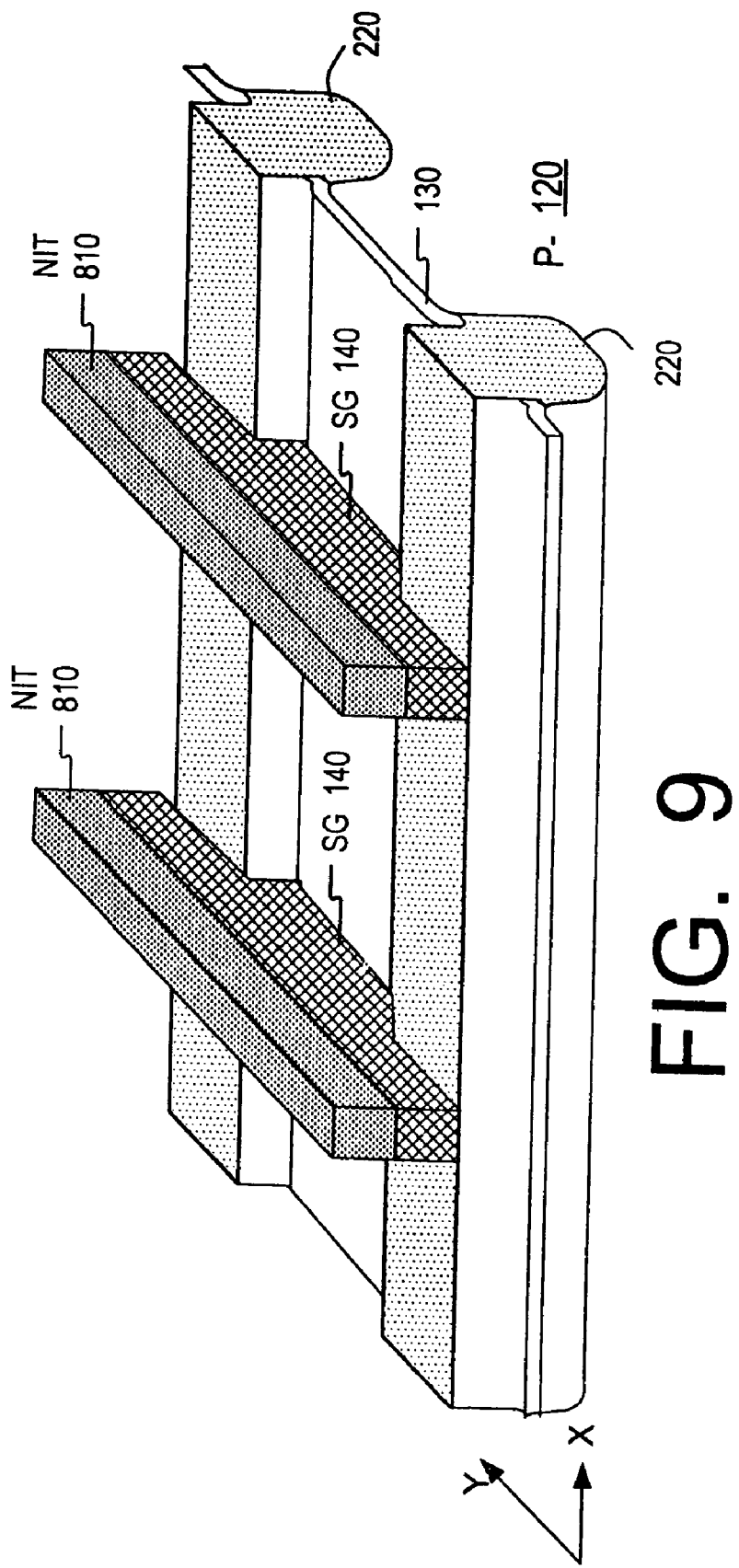
FIG. 9 is a perspective view of the memory of FIG. 2 in the process of fabrication.

The wafer is coated with a photoresist layer (not shown). The resist is patterned to define select gate lines 140. See FIG. 2, and see also the perspective view in FIG. 9. Each select gate line 140 extends in the Y direction through the entire array. The memory array geometry is not sensitive to a misalignment between the mask defining the lines 140 and the mask defining the isolation trenches 220T (FIG. 4) except possibly at the boundary of the memory array.

Silicon nitride 810 is etched through the resist openings. The resist is removed, and polysilicon 140 is etched away where exposed by nitride 810. Select gate lines 140 are formed as a result. (In an alternative embodiment, the resist defining the nitride 810 is removed after the etch of polysilicon 140.)

As shown in FIG. 10 (cross section X-X'), the structure is oxidized to grow silicon dioxide 1010 on the sidewalls of select gate lines 140. Then a thin conformal silicon nitride layer 1030 is deposited and etched anisotropically, without a mask over the memory array, to form spacers on the sidewalls of each structure consisting of a select gate line 140, the overlying nitride 810, and the sidewall oxide 1010. Formation of silicon nitride spacers is described, for example, in U.S. Pat. No. 6,355,524 issued Mar. 12, 2002 to H. Tuan et al. and incorporated herein by reference.

A blanket oxide etch removes the exposed portions of silicon dioxide 130. Silicon dioxide 150 (FIG. 11, cross section X-X') is thermally grown on substrate 120 to a desired thickness, e.g. 90 Å.

Floating gate polysilicon 160 is deposited over the structure, by LPCVD for example, and is doped during or after the deposition. Polysilicon 160 is sufficiently thick to ensure that the top surface of layer 160 is at least as high as the top surface of nitride 810. In particular, the top surface of polysilicon 160 includes regions 160T between the select gates 140. Regions 160T are at least as high as the top surface of nitride 810.

Layer 160 is planarized by a CMP process that stops on nitride 810, or by some other process. See FIG. 12 (cross section X-X'). The top surface of polysilicon 160 becomes coplanar with the top surface of nitride 810. CMP processes and slurries are known that allow one to avoid dishing in the top surface of the polysilicon layer.

Then polysilicon 160 is etched without a mask over the memory array. See FIGS. 13A (cross section X-X') and 13B (cross section Y2-Y2'). The etch stops when trench oxide 220 becomes exposed. A suitable overetch is performed to completely remove the polysilicon 160 from the top surface of oxide 220. In some embodiments, the final thickness of layer 160 is 1200 Å.

Optionally, a timed etch of oxide 220 is performed to recess the top surface of oxide 220 below the surface of polysilicon 160. See FIG. 14 (cross section Y2-Y2'). This etch will improve the capacitive coupling between the floating and control gates. See the aforementioned U.S. Pat. No. 6,355,524. In the embodiment of FIG. 14, the oxide 220 continues to protrude above the top surface of substrate 120, as shown at 220P, by at least 0.10 µm. In other embodiments, the oxide 220 does not protrude above the substrate after the etch.

ONO layer 1510 (FIG. 15A, cross section X-X') is formed over the structure. For example, a silicon dioxide layer can be thermally grown on polysilicon 160 or deposited by a high temperature oxidation process (HTO) to a thickness of 50 Å. (HTO is described, for example, in U.S. patent application published as No. 2002/0197888 on Dec. 26, 2002, incorporated herein by reference). Then a silicon nitride layer can be deposited by LPCVD to a thickness of 80 Å. Then another silicon dioxide layer can be deposited by HTO to a thickness of 50 Å. These processes and thickness values are exemplary and not limiting.

Figure 15B:
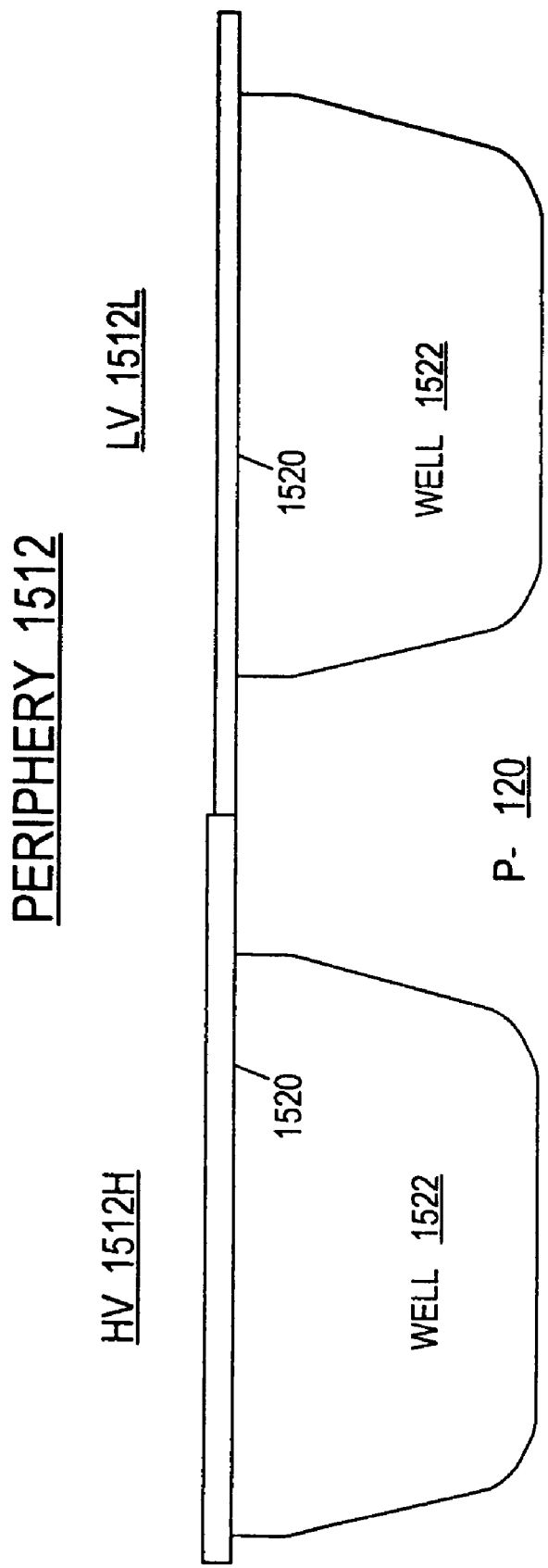

ONO 1510, polysilicon 160, and silicon dioxide 150 are removed from the memory peripheral areas 1512 (FIG. 15B). Suitable gate dielectric layers 1520 are formed on substrate 120 in the periphery by conventional means. In the example shown in FIG. 15B, the peripheral area includes a high voltage transistor area 1512H and a low voltage transistor area 1512L. Layer 1520 is formed as follows. Silicon dioxide is grown thermally or deposited by HTO to a thickness of 140 Å in the areas 1512H, 1512L. This oxide is removed from the low voltage area 1512L by a masked etch. Then another silicon dioxide layer is formed by thermal oxidation in areas 1512L, 1512H to a thickness of 60 Å. As a result, the oxide thickness in the high voltage area 1512H increases from 140 Å to 200 Å. The top oxide layer in ONO 1510 (FIG. 15A) can be made thicker and/or densified during these steps. Alternatively, the entire top oxide layer of the ONO 1510 sandwich can be formed during the formation of oxide 1520 in the periphery.

FIG. 15B also shows wells 1522 formed in substrate 120 for the NMOS and PMOS transistors in peripheral area 1512. The wells can be formed, and the threshold voltage implants can be performed into the wells, before the fabrication of oxide 1520 using known techniques.

Control gate polysilicon layer 170 (FIG. 16A, cross section X-X', and FIG. 16B, peripheral area) is deposited on ONO 1510 and dielectric 1520. Polysilicon 170 is initially undoped ("intrinsic", shown as "INTR" in FIG. 16B). Then peripheral area 1512 is masked, and polysilicon 170 is doped N+ in the memory array area.

The top surface of polysilicon 170 is not planar. Layer 170 has a protruding portion 170.1 over each select gate line 140. The protrusions 170.1 will be used to define the control and floating gates without additional dependence on photolithographic alignment.

Figure 17B:
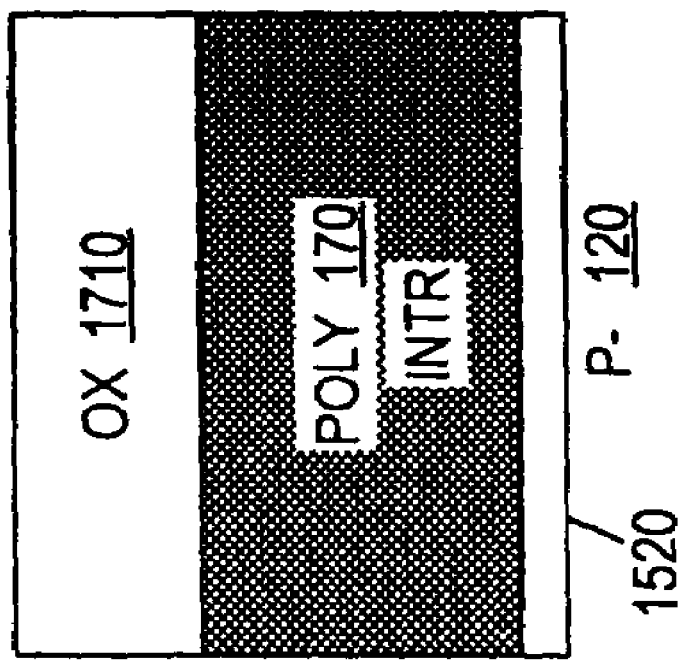

As shown in FIG. 16A, cavities 170C form in layer 170 between protrusions 170.1. As shown in FIG. 17A (cross section X-X'), these cavities are filled with some material 1710. In one embodiment, material 1710 is silicon dioxide deposited on polysilicon 170 and planarized by CMP or some other process. The memory array area has a planar top surface, with polysilicon 170 exposed. Oxide 1710 is also deposited in the peripheral area (FIG. 17B), but in some embodiments the polysilicon 170 is not exposed in the periphery by the oxide planarization. This is due to the fact that the floating gate polysilicon 160 has been removed in the periphery. Therefore, before the oxide 1710 planarization, the top level of oxide 1710 was lower in the periphery than in the array area. The oxide planarization process may or may not leave oxide 1710 in the periphery. In the example of FIG. 17B, oxide 1710 is not entirely removed from the periphery during the planarization.

Polysilicon 170 is etched without a mask selectively to oxide 1710. See FIG. 18 (cross section X-X'). This etch attacks the polysilicon portions 170.1 and creates cavities 1810 in the top surface of the structure in the memory array area. Polysilicon 170 is recessed relative to oxide 1710 in these cavities. In the embodiment of FIG. 18, this etch exposes ONO 1510, and continues for some time to recess the top surface of polysilicon 170 below the top surface of ONO 1510. This is not necessary however. The polysilicon etch can stop before exposing the ONO 1510, or the etch can stop when the ONO layer becomes exposed. If ONO 1510 is exposed, the width W1 of the polysilicon layer 170 in cavities 1810 on a side of select gate 140 will define the width of the control and floating gates in a self-aligned manner as will be illustrated below.

In some embodiments, the minimum thickness of polysilicon 170 (at the bottom of cavities 1810) is 0.18 µm, and the width W1 is also 0.18 µm. In FIG. 18, the top surface of polysilicon 170 is recessed in cavities 1810. In another embodiment, polysilicon 170 has a planar top surface throughout the memory array area.

In the peripheral area (FIG. 17B), polysilicon 170 is protected by oxide 1710, so the peripheral area is unchanged by the polysilicon etch. If oxide 1710 was removed in the periphery during the oxide planarization process (described above in connection with FIG. 17A), then the polysilicon 170 can be protected in the periphery by an additional mask (not shown) during the polysilicon etch.

Figure 19B:
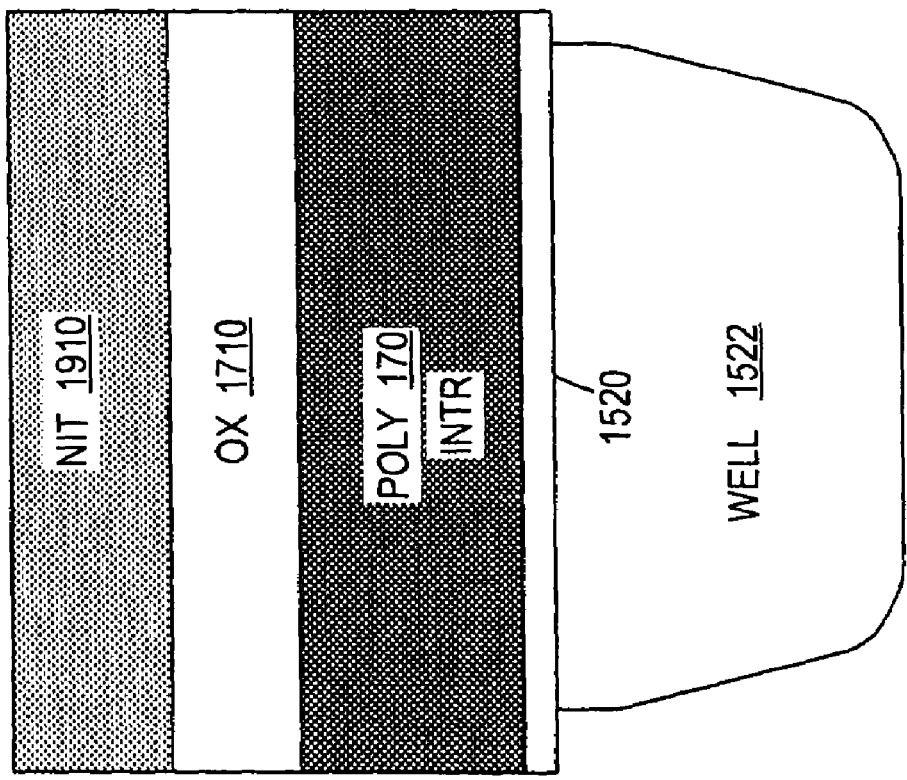

A protective layer is formed in cavities 1810 to protect the polysilicon 170 near the select gates 140. In one embodiment, this layer 1910 is silicon nitride (see FIG. 19A, cross section X-X', and FIG. 19B, cross section of periphery 1512). Nitride 1910 is deposited over the structure and polished by CMP until the oxide 1710 is exposed in the memory array area. See FIG. 20A (cross section X-X'). Nitride 1910 remains in cavities 1810.

Instead of CMP, the nitride 1910 can be processed by depositing a layer of material (not shown) having a planar top surface, and etching that material and the nitride with equal etch rates until the oxide 1710 is exposed. The material can be photoresist. The material can be removed after the nitride etch.

In peripheral area 1512, the top level of nitride 1910 may have been lower before the nitride planarization than in the array area due to the absence of floating gate polysilicon 160 in the periphery. The nitride planarization may or may not remove the nitride 1910 in the periphery. In one embodiment, the nitride is not removed, so the peripheral area remains as in FIG. 19B.

An antireflective coating layer (ARC) 2010, shown in FIG. 20A, is flowed on nitride 1910 and cured. The structure has a planar top surface after this step.

Figure 20B:
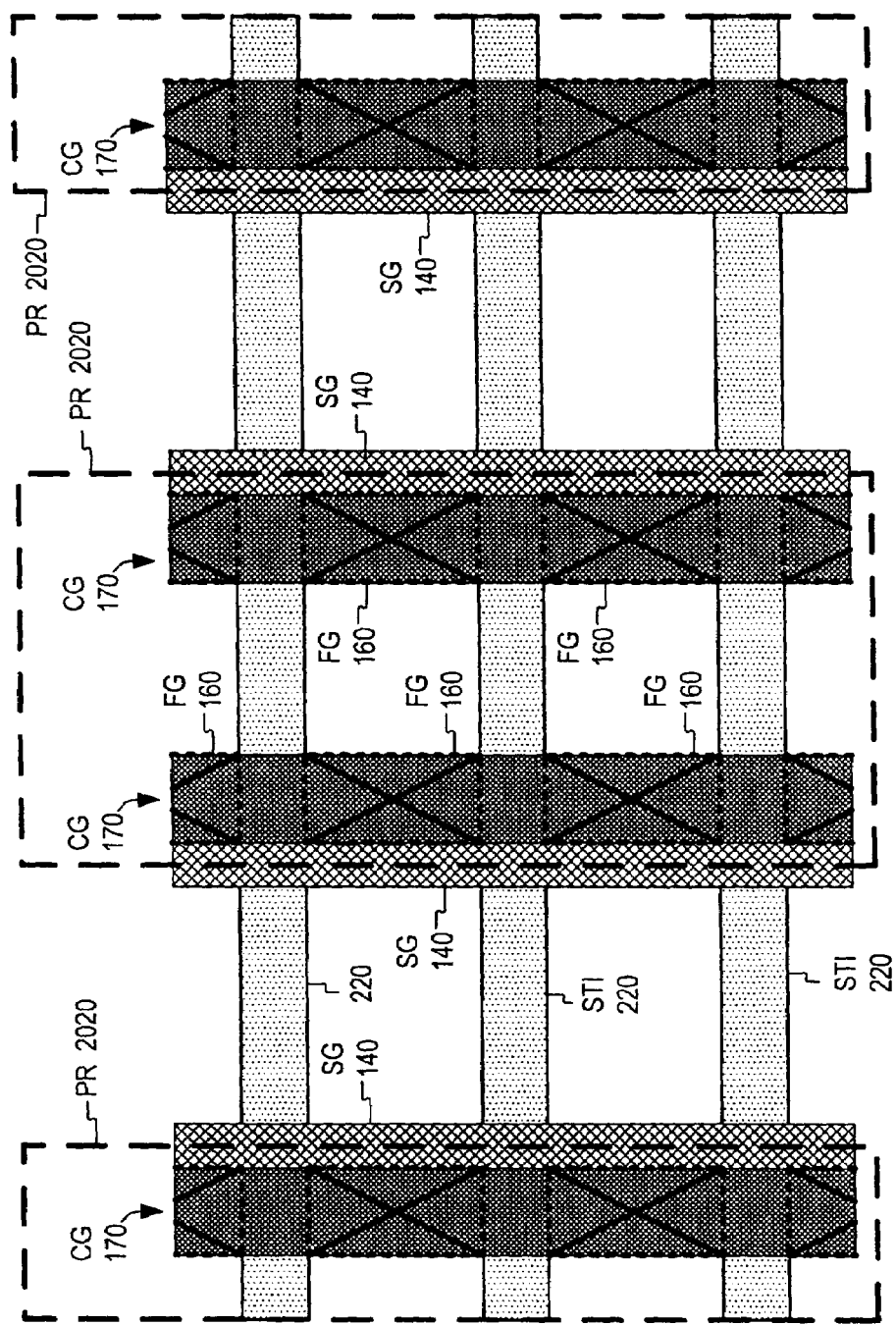
FIG. 20B is a top view of the structure of FIG. 20A.

The wafer is coated with a photoresist layer 2020. The resist is patterned to protect the portion of nitride 1910 on one side of each select gate line 140. FIG. 20B (top view) illustrates the position of mask 2020 with respect to the features shown in FIG. 2. Resist 2020 overlies the future positions of control gate lines 170, and exposes those areas between the adjacent select gate lines 140 in which the control gate polysilicon 170 will be removed. The longitudinal edges of mask 2020 can be located anywhere over the select gate lines 140. The precise mask alignment is therefore not critical in the array area.

Resist 2020 does not cover the peripheral area 1512.

Silicon nitride 1910 and ARC 2010 are etched away where exposed by resist 2020. Resist 2020 and the remaining portions of ARC 2010 are then removed. The resulting memory array structure is shown in FIG. 21 (cross section X-X'). Nitride 1910 protects the polysilicon 170 portions of the width W1 (FIGS. 18, 21) at the bottom of cavities 1810.

The nitride etch removes nitride 1910 in the peripheral area. The peripheral area becomes as in FIG. 17B.

Oxide 1710 is etched away by a blanket etch in the array and peripheral areas. The resulting structure is shown in FIGS. 22A (cross section X-X') and 22B (periphery).

Then the wafer is coated with a photoresist layer (not shown). The resist is patterned to cover the peripheral area. The resist does not cover the memory array. Polysilicon 170 is etched in the array area with nitride 1910 as a mask. The etch is selective to silicon dioxide, so the etch stops on ONO 1510. The resulting structure is shown in FIG. 23 (cross section X-X'). ONO 1510 and polysilicon 160 are etched with nitride 1910 as a mask in the array area. Layers 1510, 160 are completely removed from the areas not covered by nitride 1910. See FIG. 24 (cross section X-X'). Nitride layers 1910, 810, 1030 can be partially removed during the etch of ONO 1510. Floating gates 160 and control gate lines 170 are fully defined at the conclusion of this step, and are as in FIGS. 2 and 3. The width of the top surface of control gate line 170 is W1, defined as described above in connection with FIG. 18.

The memory of FIG. 24 has a reliable sidewall insulation between select gate 140 on the one hand, and the floating gate 160 and the control gate 170 on the other hand. The insulation is provided by layers 1010, 1030. In this respect, the structure of FIG. 24 favorably compares with the memory described in the aforementioned article by Naruke et al. In the Naruke et al. memory, the floating and control gates are formed first in a stacked configuration. Then the select gate is formed as a sidewall spacer. Forming a good sidewall insulation on the stack of the floating and control gates is problematic because the floating and control gate layers may have "shoulders" protruding out of the stack. The sidewall insulation can get thinned on the shoulders. Good sidewall insulation is easier to form on the sidewall of the select gate 140 of FIG. 24 because the select gate is not stacked together with any other conductive layers. The invention is not limited to the embodiment of FIG. 24 however, or to the embodiments in which the select gate is not stacked with other conductive layers.

Other advantages of forming the select gate before forming stacked floating and control gates are as follows. If the stack of the floating and control gates is formed first, the etch of the floating and control gate layers may damage the active areas in substrate 120 (if the floating and control gates are made of polysilicon, for example). The active area damage may impede formation of select gate dielectric 130.

Also, in some embodiments, the select gate dielectric 130 is a thermally grown layer of silicon dioxide. If the floating and control gates are formed first, the thermal oxidation that forms the oxide 130 may undesirably oxidize the edges of the floating and control gates. Further, in some embodiments, oxide 130 is thicker than floating gate dielectric 150, and therefore it is desirable to form the oxide 130 early in the fabrication process.

After the etch of polysilicon 160, the resist protecting the peripheral area is removed. The peripheral area remains as in FIG. 22B. Polysilicon 170 is exposed and available for doping in the periphery. The NMOS transistor gates can be doped type N, and the PMOS transistor gates can be doped type P, during the source/drain implants as described below.

Figure 25:
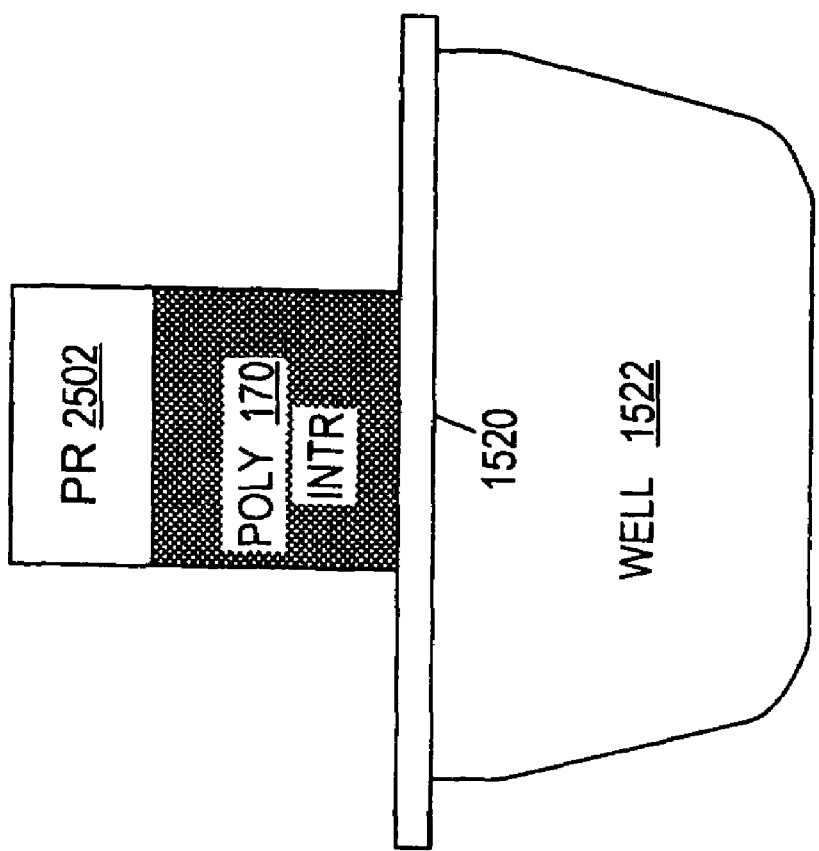

The wafer is coated with a photoresist layer 2502 (FIG. 25). The resist is patterned to define the peripheral transistor gates. Resist 2502 covers the memory array. Exposed polysilicon 170 is etched away. Resist 2502 is removed.

Figure 26B:
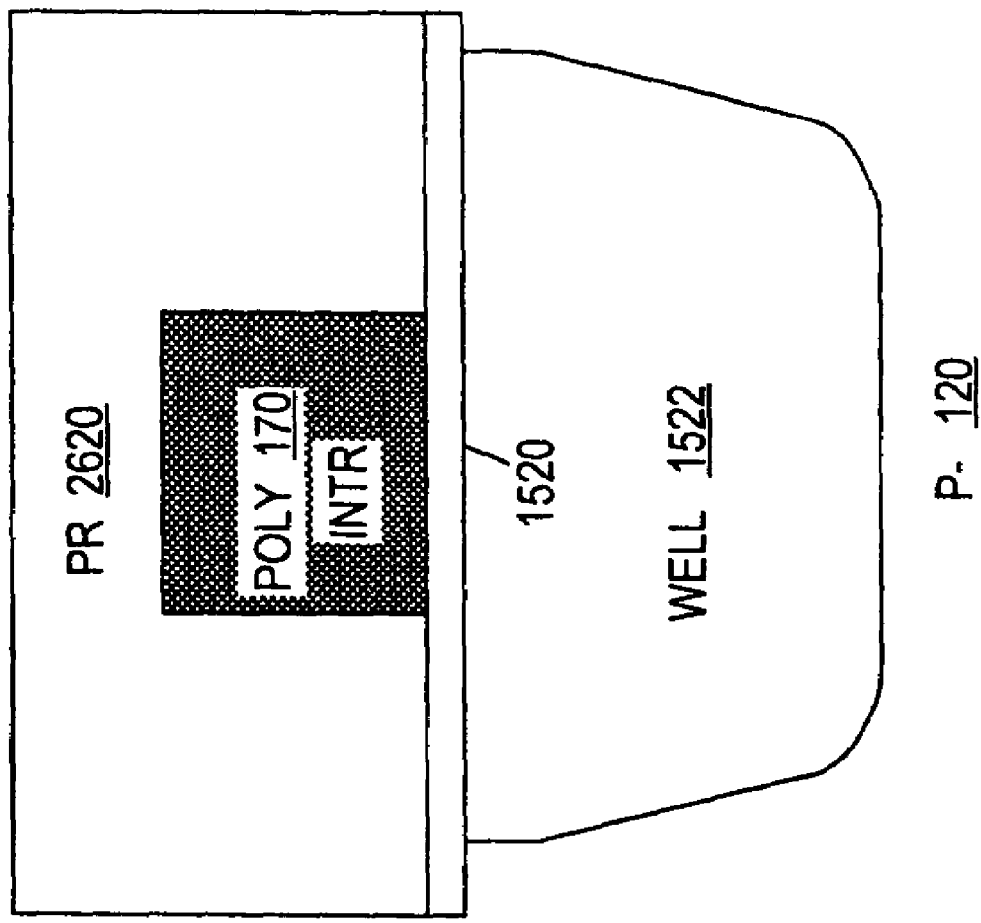
Figure 26C:
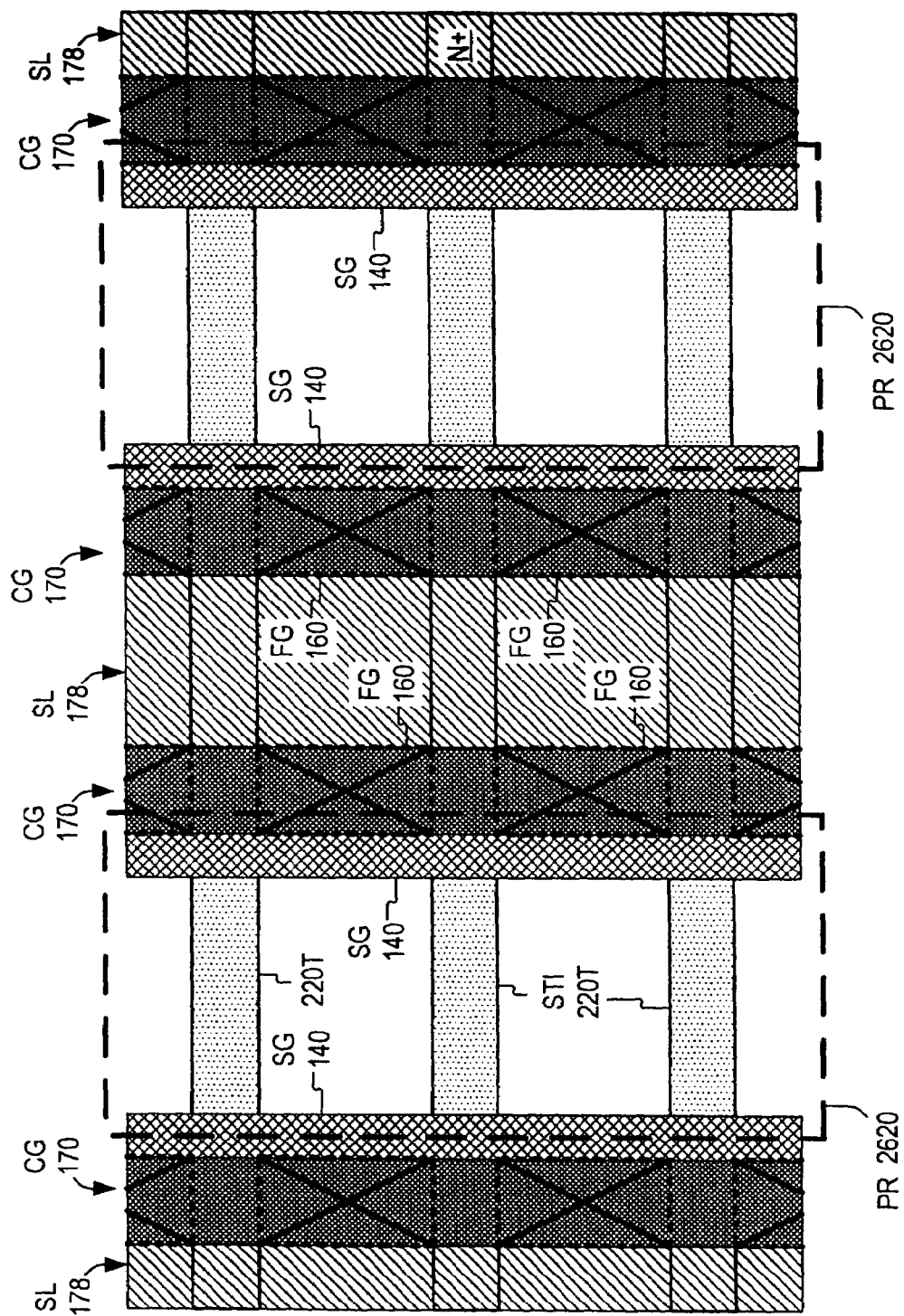
FIG. 26C is a top view of the structure of FIG. 26A.

The wafer is coated with photoresist 2620. The resist is patterned to expose the source lines 178 (FIG. 26A, cross section X-X', and FIG. 26B, top view of the array without the dielectric layers). Each source line 178 traverses the memory array between two adjacent control gate lines 170, and provides one source/drain region to each cell in the two rows associated with the two control gate lines.

The alignment of mask 2620 is not critical because the left and right edges of the mask openings can be positioned anywhere over the respective select gate lines 140 or control gate lines 170.

Resist 2620 covers the peripheral area.

Silicon dioxide 220 is etched out of trenches 220T in the areas exposed by mask 2620, i.e. the areas of source lines 178. This etch removes oxide 150 in the active areas over the source lines. Then the source line implant (N+) is performed using the same mask. In some embodiments, this is a high energy, high dose implant, possibly preceded by a lower energy, low dose, large angled implant (the angle can be 10° to 30° for example), to achieve a 0.1 µm to 0.2 µm source line diffusion depth.

In an alternative embodiment, mask 2620 is formed, then a high energy N+ implant is performed before etching out the oxide 220, then the oxide 220 is etched out of the trenches using the same mask, and then another, lower energy N type implant is performed using the same mask. The first (high energy) implant is at least partially blocked by oxide 220 in the trenches to avoid shorting the source lines 178 to N type isolation region 604 (FIG. 6). See the aforementioned U.S. Pat. No. 6,355,524.

Figure 27:
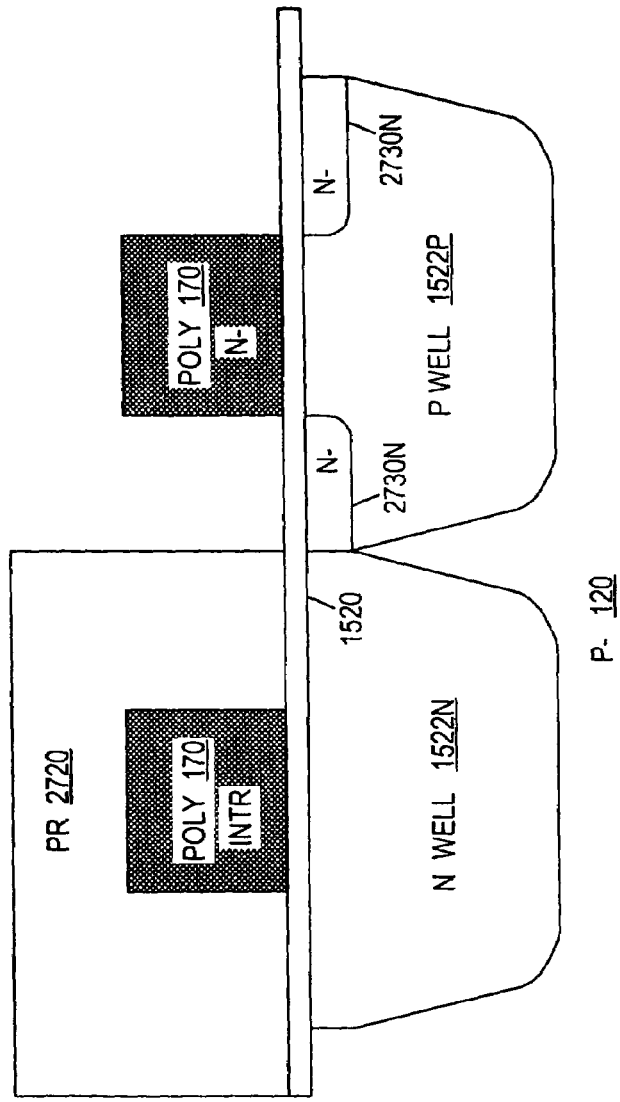

Resist 2620 is removed. The wafer is coated with a photoresist layer 2720 (FIG. 27). The resist is patterned to expose the entire array area and also to expose the peripheral NMOS transistor regions. FIG. 27 shows a peripheral NMOS transistor region 1512N with a P well 1522P, and a peripheral PMOS transistor region 1512P with an N well 1522N. Wells 1522N, 1522P are two of the wells 1522 generally shown in FIG. 15. There can be many regions 1512N, 1512P in the integrated circuit. Resist 2720 covers the PMOS transistor regions 1512P. An N type implant (N−) is performed to form the LDD (lightly doped drain) extensions for NMOS source/drain regions 2730N. This implant also dopes the gates of the peripheral NMOS transistors. Resist 2720 may or may not cover the memory array. If the resist 2720 does not cover the array, the implant provides additional doping for the source lines 178 and also dopes bitline regions 174 (FIG. 29A).

Figure 28:
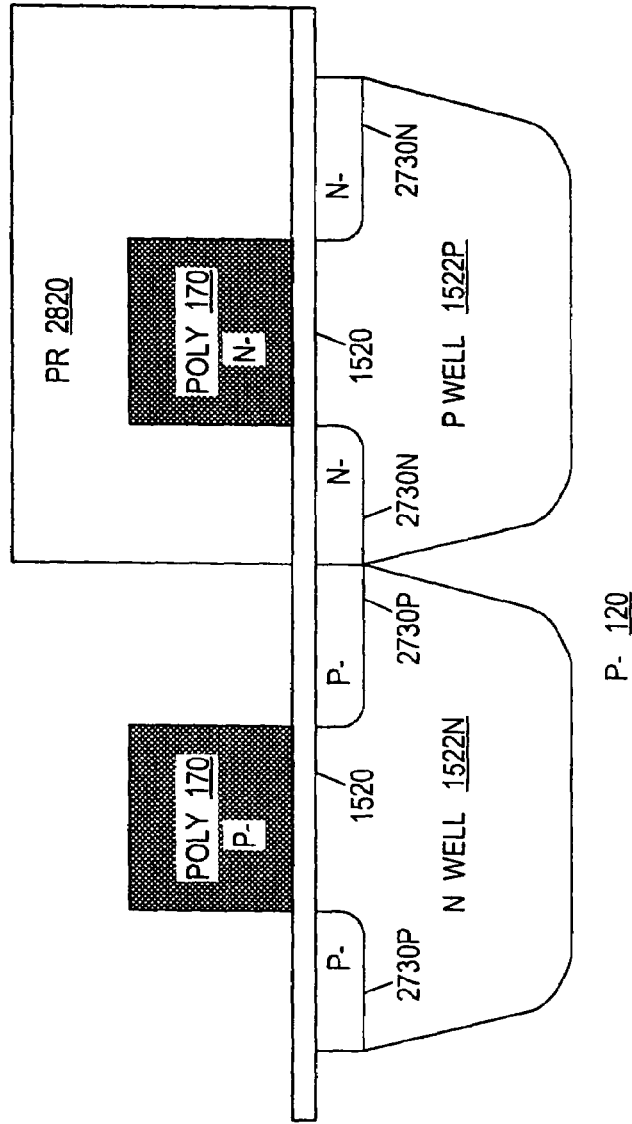

Resist 2720 is removed, and another photoresist layer 2820 (FIG. 28) is formed on the wafer. Resist 2820 is patterned to cover the NMOS peripheral transistor regions 1512N and the array area. A P type implant (P−) is performed to form the LDD extensions for PMOS source/drain regions 2730P and dope the gates of the peripheral PMOS transistors.

Resist 2820 is removed. A thin silicon dioxide layer 2904 (FIG. 29A, cross section X-X', and FIG. 29B, peripheral area) is deposited over the structure by any suitable technique (e.g. TEOS, HTO, RTO). An exemplary thickness of oxide 2904 on the silicon surfaces of substrate 120 and layer 170 is 200 Å to 300 Å. If oxide 2904 is deposited thermally (e.g. by RTO, rapid thermal oxidation), the oxide will be much thinner on the silicon nitride surfaces.

Figure 29B:
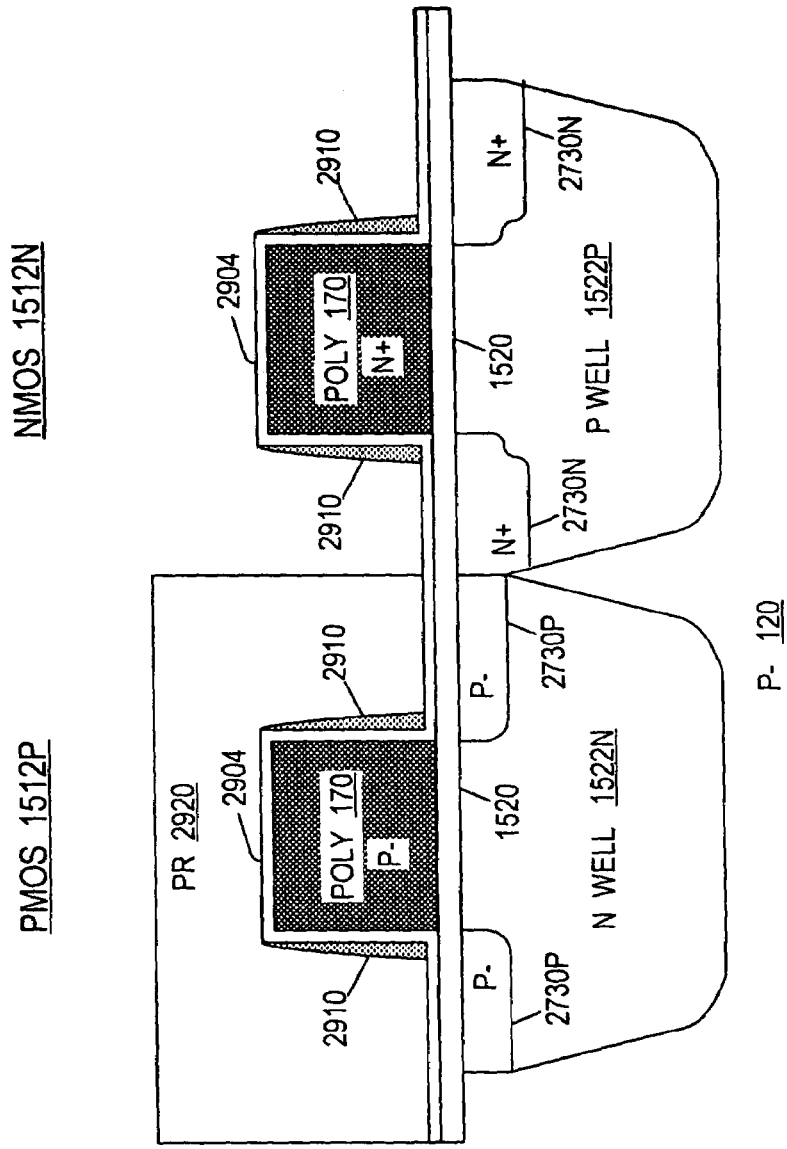
Figure 29C:
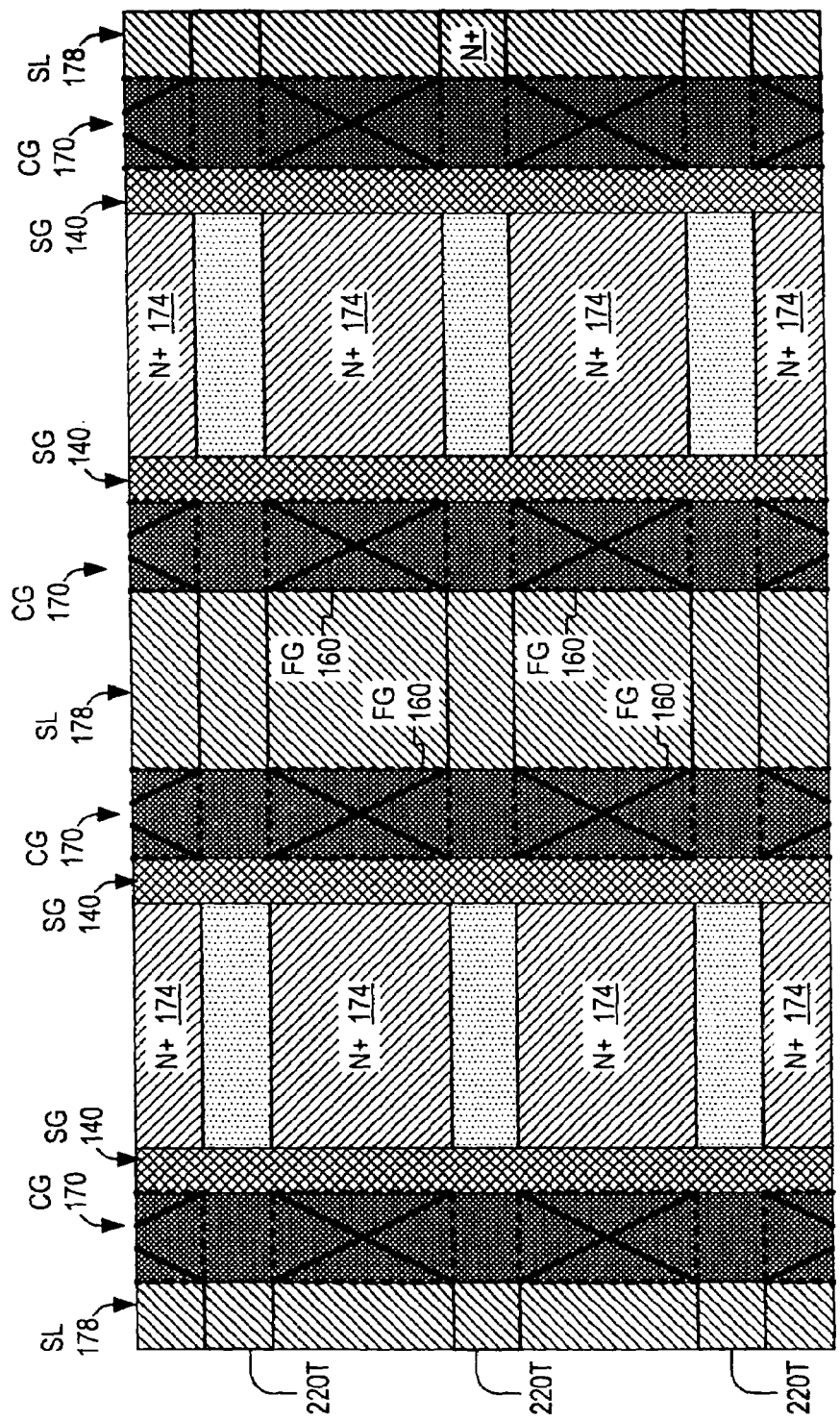
FIG. 29C is a top view of the structure of FIG. 29A.

A thin silicon nitride layer 2910 is deposited and etched anisotropically without a mask to form sidewall spacers on the gates of the peripheral transistors. Spacers 2910 also form in the memory array. Oxide 2904 serves as an etch stop protecting the substrate 120 and the top surfaces of peripheral polysilicon gates 170. The wafer is coated with a photoresist layer 2920 (FIG. 29B). The resist is patterned to cover the PMOS peripheral regions 1512P but expose the NMOS peripheral regions 1512N and the memory array. An N+ implant is performed to create LDD structures for the peripheral NMOS transistors, increase the dopant concentration in the peripheral NMOS transistor gates and in source line regions 178, and to dope bitline regions 174. FIG. 29C is a top view of the resulting memory array structure. The floating, control and select gates and the overlying nitride layers mask this implant so no additional masking in the array area is needed.

Figure 30:
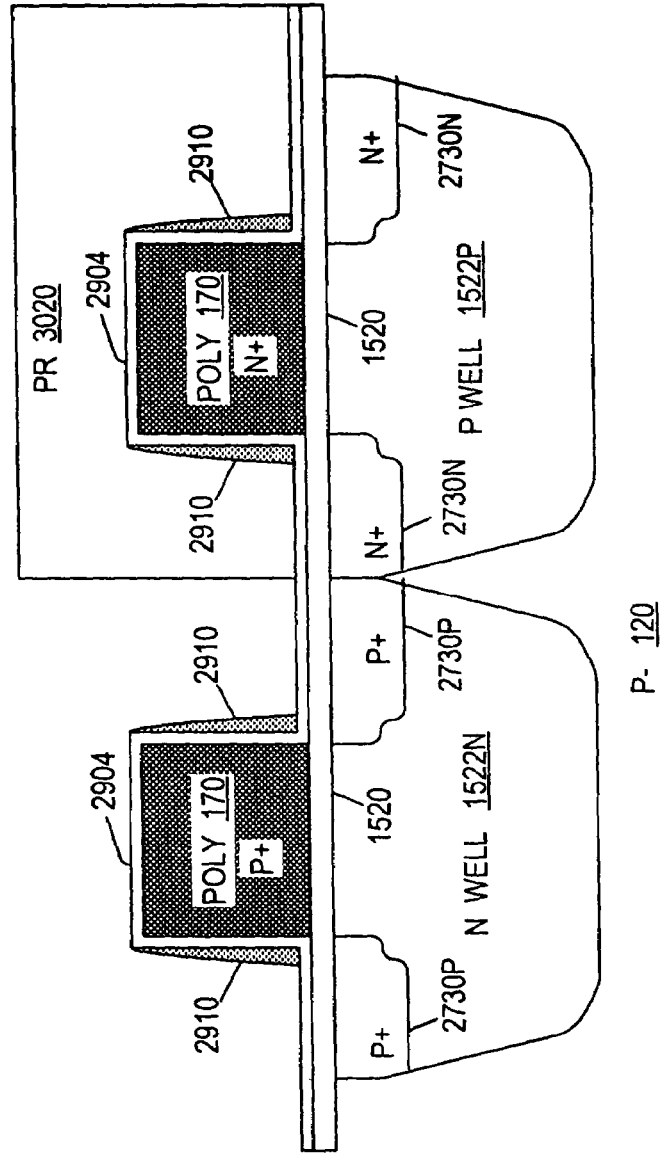
FIGS. 30, 31 show cross sections of the memory of FIG. 2 in the process of fabrication.

Resist 2920 is removed. The wafer is coated with a photoresist layer 3020 (FIG. 30). The resist is patterned to cover the NMOS peripheral regions 1512N and the memory array but to expose the PMOS peripheral regions 1512P. A P+ implant is performed to form the LDD structures for the PMOS transistors and to increase the dopant concentration in the PMOS transistor gates.

Figure 31:
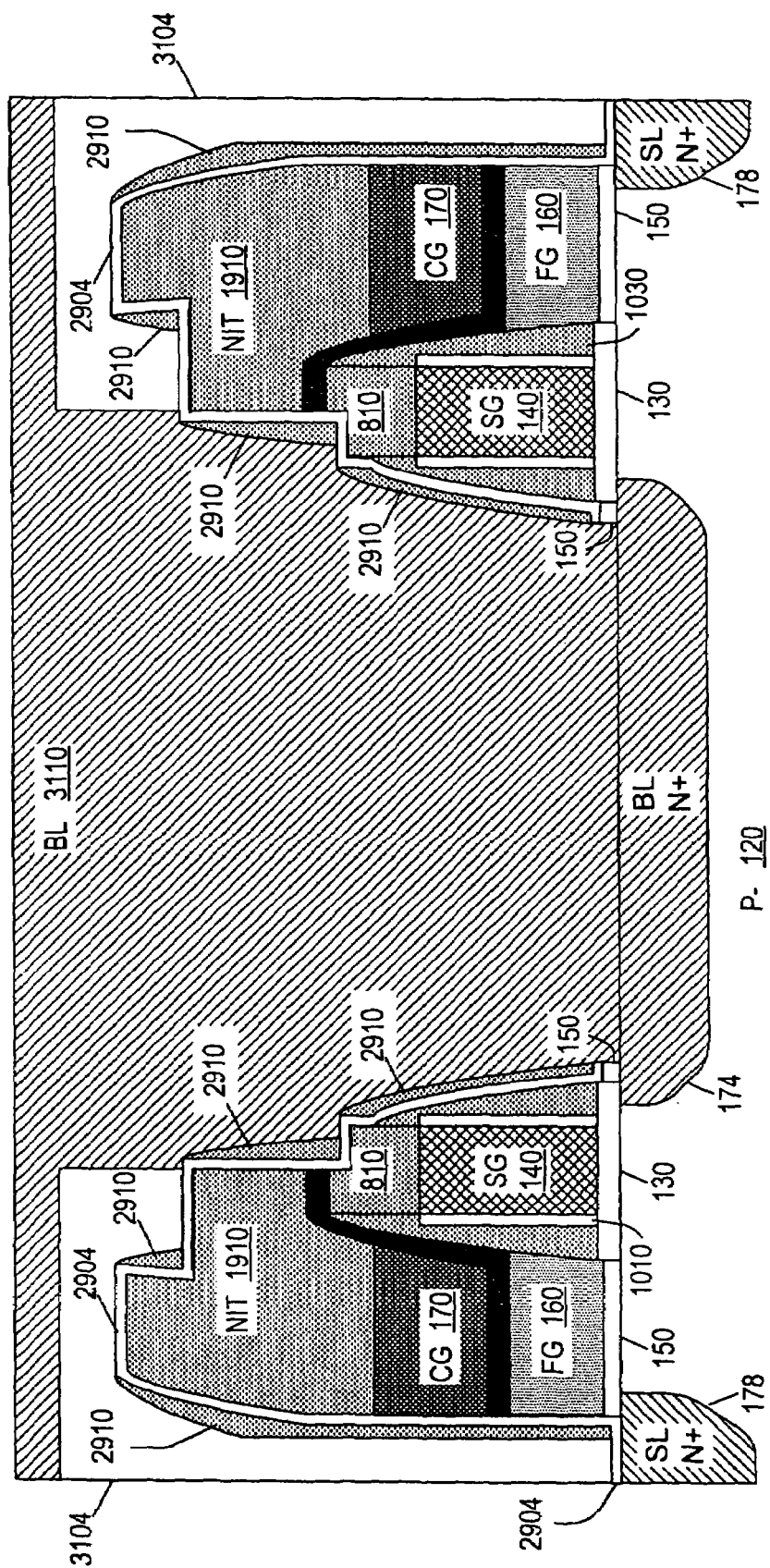

The memory fabrication can be completed using known techniques. In the example of FIG. 31, inter-level dielectric 3104 is deposited over the wafer. Contact openings are etched in dielectric layers 3104, 2904, 150 to expose the bitline regions 174. A conductive layer 3110 is deposited and patterned to form the bitlines. The bitlines contact the bitline regions 174. If the layers 3104, 2904, 150 are formed from silicon oxide, the alignment of the mask (not shown) defining the contact openings is not critical because the select gates 140 are protected by nitride layers 2910, 1030.

Figure 32:
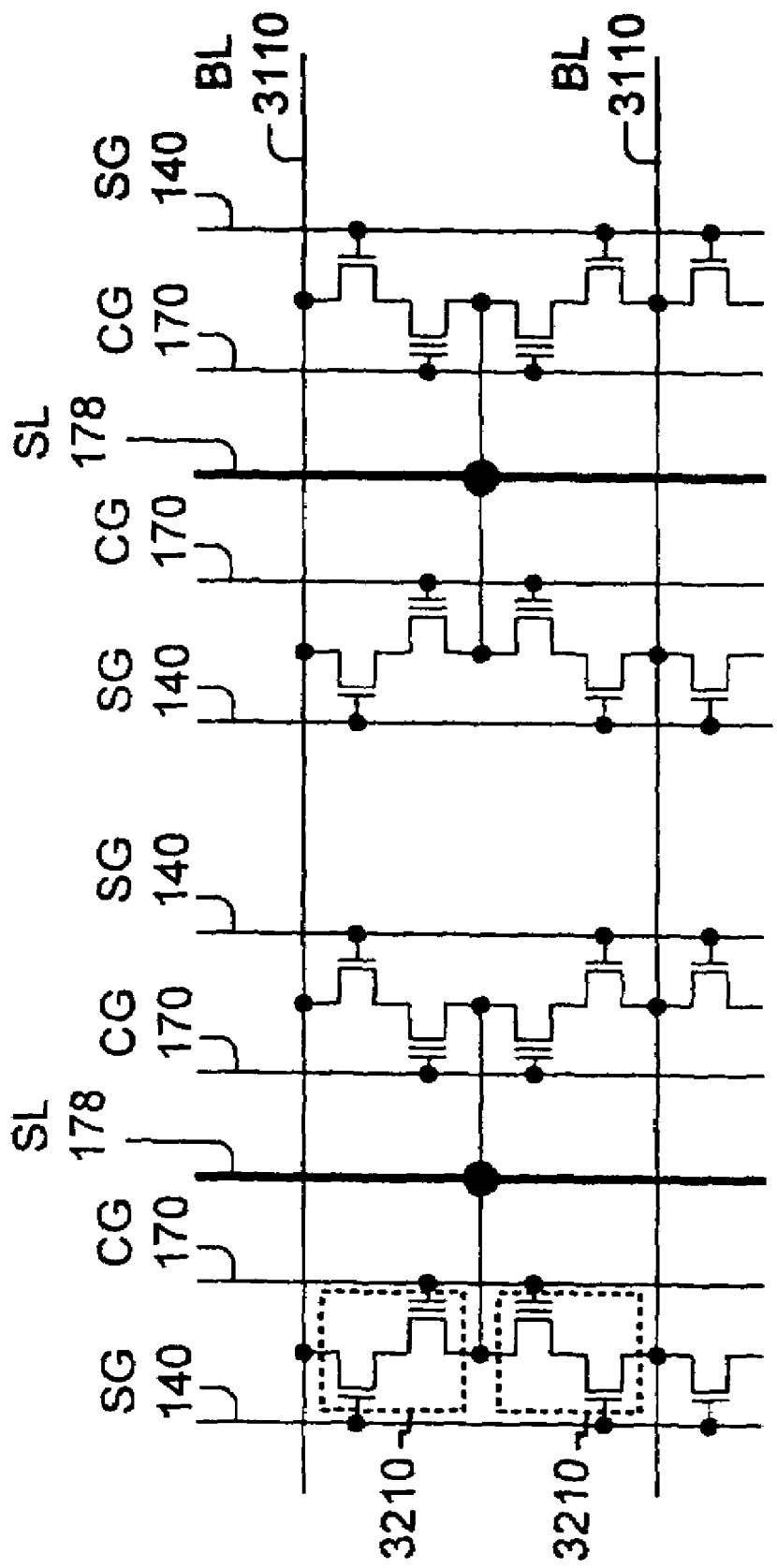
FIG. 32 is a circuit diagram of the memory of FIG. 2.

FIG. 32 is a circuit diagram of one embodiment of the array. This is a NOR array, of the type described in the aforementioned U.S. Pat. No. 6,355,524. Each bitline 3110 is shared by two columns of the memory cells 3210. A cell 3210 is programmed by hot electron injection from the cell's channel region (the P type region in substrate 120 below the cell's floating and select gates) to floating gate 160. The cell is erased by Fowler-Nordheim tunneling of electrons from floating gate 160 to source line region 178 or the channel region.

Figure 33:
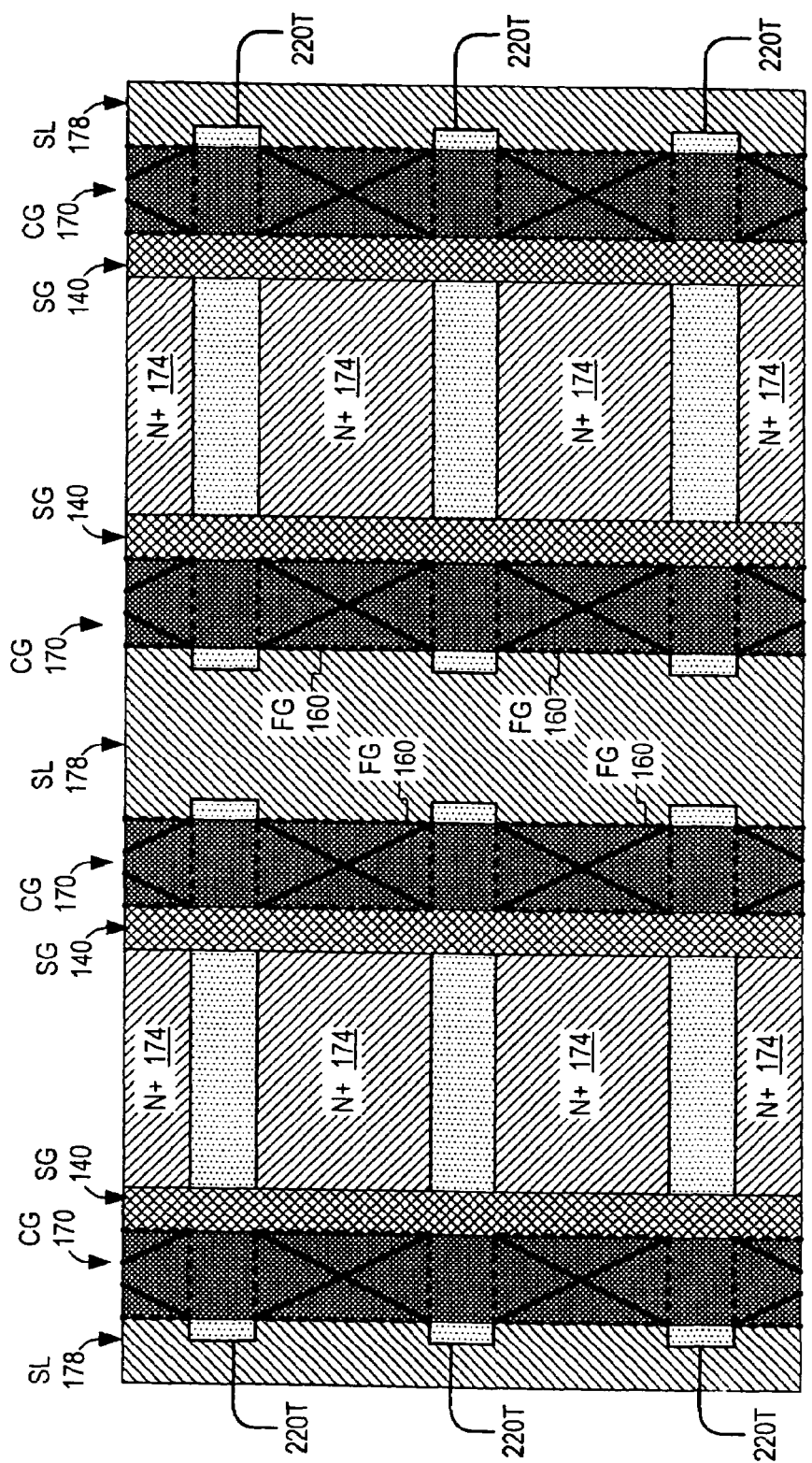
FIG. 33 is a top view of a memory array according to one embodiment of the present invention.

The invention is not limited to such erase or programming techniques or to NOR memory arrays. The invention is not limited to the array architectures described above. For example, the source lines can be formed from a layer overlying the substrate 120 and contacting the source line substrate regions 178; the source lines do not have to go through the isolation trenches. Also, substrate isolation regions 220 do not have to traverse the entire array. In FIG. 33, the substrate isolation regions are interrupted at source lines 178. Dielectric 220 does not have to be etched out of the trenches before the source lines are doped. Shallow trench isolation can be replaced with LOCOS or other isolation types, known or to be invented. The invention is applicable to multi-level cell memories (the memories in which the cell may contain multiple bits of information). The invention is not limited to any particular processing steps, materials, or other particulars described above. The invention is not limited to LDD or other peripheral structures. Other embodiments and variations are within the scope of the invention, as defined by the appended claims.

The invention claimed is:

1. An integrated circuit comprising a nonvolatile memory cell, the integrated circuit comprising:
   a semiconductor substrate;
   a first dielectric region on the semiconductor substrate;
   a first conductive gate on the first dielectric region, the first conductive gate being part of the memory cell;
   a second dielectric region on the semiconductor substrate;
   a conductive floating gate on the second dielectric region, the floating gate being part of the memory cell;
   a dielectric layer comprising a continuous feature overlying the floating gate and also overlying the first conductive gate; and
   a second conductive gate overlying the continuous feature of the dielectric layer and also overlying the floating gate but not overlying the first conductive gate, wherein the continuous features of the dielectric layer is present between the floating gate and the second conductive gate, the second conductive gate being part of the memory cell, the second conductive gate being insulated from the first conductive gate;

wherein the memory cell further comprises two source/drain regions of a first conductivity type in the semiconductor substrate, and a channel region of a second conductivity type in the semiconductor substrate, the channel region extending under the first conductive gate and the floating gate between the two source/drain regions.

2. The integrated circuit of claim 1 wherein the continuous feature of the dielectric layer insulates the second conductive gate from the floating gate and from the first conductive gate.

3. The integrated circuit of claim 1 wherein the floating gate does not overlie the first conductive gate.

4. The integrated circuit of claim 1 wherein the continuous feature of the dielectric layer overlies the entire floating gate and a portion of the first conductive gate but not the entire first conductive gate.

5. The integrated circuit of claim 1 wherein the dielectric layer comprises a silicon nitride layer.

6. The integrated circuit of claim 1 wherein the dielectric layer comprises a silicon oxide layer and a silicon nitride layer on the silicon oxide layer, the silicon nitride layer and the silicon oxide layer both overlying the floating gate and at least a portion of the first conductive gate.

7. The integrated circuit of claim 1 wherein the dielectric layer is ONO.

8. An integrated circuit comprising a nonvolatile memory cell, the integrated circuit comprising:
   a semiconductor substrate;
   a first dielectric region on the semiconductor substrate;
   a first conductive gate on the first dielectric region, the first conductive gate being part of the memory cell;
   a second dielectric region on the semiconductor substrate;
   a conductive floating gate on the second dielectric region, the floating gate being part of the memory cell;
   a dielectric layer comprising a continuous feature overlying the floating gate and also overlying the first conductive gate; and
   a second conductive gate overlying the continuous feature of the dielectric layer and also overlying the floating gate but not overlying the first conductive gate, wherein the continuous features of the dielectric layer is present between the floating gate and the second conductive gate, the second conductive gate being part of the memory cell, the second conductive gate being insulated from the first conductive gate;
   wherein the memory cell is one of a plurality of memory cells;
   wherein the semiconductor substrate comprises a plurality of substrate isolation regions between active areas of the semiconductor substrate, each substrate isolation region being a dielectric region protruding above the semiconductor substrate;
   wherein each memory cell comprises a first dielectric region on an active area of the semiconductor substrate;
   wherein the first conductive gate is part of a conductive line G1 which crosses over a plurality of the substrate isolation regions and over the first dielectric regions and provides a first conductive gate to each of the memory cells;
   wherein each memory cell comprises a second dielectric region on the semiconductor substrate, and a conductive floating gate on the second dielectric region;
   wherein said continuous feature of the dielectric layer overlies the floating gates and the first conductive gates of the memory cells;
   wherein the second conductive gate is part of a conductive line G2 providing second conductive gates to the memory cells, wherein the line G2 crosses over a plurality of the substrate isolation regions and overlies the floating gates but does not overlie the line G1, wherein the continuous feature of the dielectric layer is present between each floating gate and the line G2, the line G2 being insulated from the line G1.

9. The integrated circuit of claim 8 wherein the floating gates do not overlie the line G1.

10. The integrated circuit of claim 8 wherein the plurality of memory cells is a row of memory cells in a memory array having a plurality of rows of nonvolatile memory cells;
   wherein each memory cell comprises a first dielectric region on an active area of the semiconductor substrate;
   wherein the line G1 is one of a plurality of conductive lines G1 each of which crosses over a plurality of the substrate isolation regions and over the first dielectric regions of at least one row of the memory cells and provides a first conductive gate to each memory cell in at least one row of the memory cells;
   wherein each memory cell comprises a second dielectric region on the semiconductor substrate, and a conductive floating gate on the second dielectric region;
   wherein the continuous feature of the dielectric layer is one of a plurality of continuous features of the dielectric layer, wherein each continuous feature overlies the floating gates and the first conductive gates of at least one row of the memory cells;
   wherein the conductive line G2 is one of a plurality of conductive lines G2, each line G2 providing second conductive gates to at least one row of the memory cells, wherein each line G2 crosses over a plurality of the substrate isolation regions and overlies the floating gates of at least one row of the memory cells but does not overlie the line G1 of the corresponding row of the memory cells, wherein for each line G2 a corresponding continuous feature of the dielectric layer is present between the line G2 and the floating gates overlain by the line G2, the line G2 being insulated from the corresponding line G1.

11. The integrated circuit of claim 10 wherein the floating gates do not overlie the lines G1.

12. An integrated circuit comprising a nonvolatile memory comprising:
   a semiconductor substrate;
   a plurality of substrate isolation regions in the semiconductor substrate between active areas of the semiconductor substrate, each substrate isolation region being a dielectric region protruding above the semiconductor substrate;
   a plurality of conductive lines G1, each conductive line G1 overlying at least one active area, each first conductive gate comprising a portion of a line G1, each line G1 being insulated from the semiconductor substrate, wherein the top surface of the line G1 is planar but the bottom surface of the line G1 goes up and down over the substrate isolation regions;

a dielectric over a sidewall of the line G1;

a plurality of conductive floating gates abutting the dielectric over the sidewall of the line G1, the floating gates being insulated from the line G1 and the semiconductor substrate, each floating gate extending between adjacent substrate isolation regions;

a plurality of conductive lines G2, each line G2 overlying at least said sidewall of a corresponding line G1 and extending along the sidewall over plural floating gates, each line G2 being insulated from the corresponding line G1 and from the underlying floating gates.

13. The integrated circuit of claim 12 wherein the memory comprises an array area comprising an array of said floating gates, and each substrate isolation region traverses the entire array area.

* * * * *